(12) United States Patent
Yang et al.

(10) Patent No.: US 10,205,809 B2
(45) Date of Patent: Feb. 12, 2019

(54) ELECTRONIC DEVICE AND METHOD FOR MANUFACTURING THE SAME

(71) Applicant: SAMSUNG ELECTRONICS CO., LTD., Suwon-si, Gyeonggi-do (KR)

(72) Inventors: Hae-Jung Yang, Suwon-si (KR);
Seung-Joo Lee, Suwon-si (KR);
Kwang-Eun Go, Seoul (KR);
Kang-Sik Kim, Suwon-si (KR);
Jae-Hoon Woo, Suwon-si (KR);
Jong-Min Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 15/287,900

(22) Filed: Oct. 7, 2016

(65) Prior Publication Data

US 2017/0155746 A1 Jun. 1, 2017

(30) Foreign Application Priority Data

Nov. 30, 2015 (KR) .......................... 10-2015-0169359

(51) Int. Cl.
*H04M 1/02* (2006.01)
*H05K 7/20* (2006.01)
(Continued)

(52) U.S. Cl.
CPC .......... *H04M 1/026* (2013.01); *G06F 1/1637* (2013.01); *G06F 1/203* (2013.01); *H04M 1/0266* (2013.01);
(Continued)

(58) Field of Classification Search
CPC ........................... H04M 1/026; H04M 1/0266
(Continued)

(56) References Cited

U.S. PATENT DOCUMENTS 7,276,273 B2 10/2007 Clovesko et al.
9,652,005 B2 * 5/2017 Saeidi ..................... G06F 1/206
(Continued)

FOREIGN PATENT DOCUMENTS

JP 2015-219639 12/2015
KR 10-2015-0080438 7/2015
KR 10-2015-0098220 8/2015

*Primary Examiner* — Ankur Jain
(74) *Attorney, Agent, or Firm* — Nixon & Vanderhye P.C.

(57) ABSTRACT

A method for manufacturing an electronic device, according to the present disclosure, may include: detecting positions of one or more heat sources, which are disposed in a printed circuit board or in a display of the electronic device, or a path of the heat that is diffused from the heat sources; selecting a heat radiating structure to correspond to the positions of the heat sources or the diffusion path; selecting an adiabatic member or a heat radiating member, which is disposed based the selected heat radiating structure to block or radiate the heat transferred from the heat source; and forming the selected heat radiating structure or disposing the selected adiabatic member or heat radiating member on the periphery of the heat source or on the diffusion path. According to various embodiments of the disclosure, the heat radiation improvement can be maximized and/or improved by improving the structure of a heat radiation path of the electronic device and by selecting and disposing heat radiating members in appropriate positions.

12 Claims, 16 Drawing Sheets

(51) Int. Cl.
*H05K 9/00* (2006.01)
*G06F 1/16* (2006.01)
*G06F 1/20* (2006.01)

(52) U.S. Cl.
CPC ....... *H04M 1/0277* (2013.01); *H04M 1/0279* (2013.01); *H05K 7/20509* (2013.01); *H05K 9/0007* (2013.01)

(58) Field of Classification Search
USPC .......................................................... 455/566
See application file for complete search history.

(56) References Cited

U.S. PATENT DOCUMENTS

| | | | | |
|---|---|---|---|---|
| 2004/0214543 | A1* | 10/2004 | Osone | H01G 5/16 455/197.2 |
| 2005/0208914 | A1* | 9/2005 | Ogawa | H01L 21/4857 455/193.1 |
| 2015/0350392 | A1* | 12/2015 | Park | H04M 1/0202 455/575.6 |
| 2016/0255184 | A1* | 9/2016 | Hwang | H04B 5/0031 455/41.1 |

\* cited by examiner

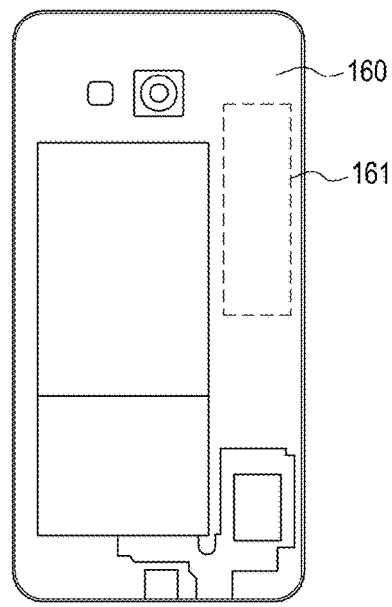
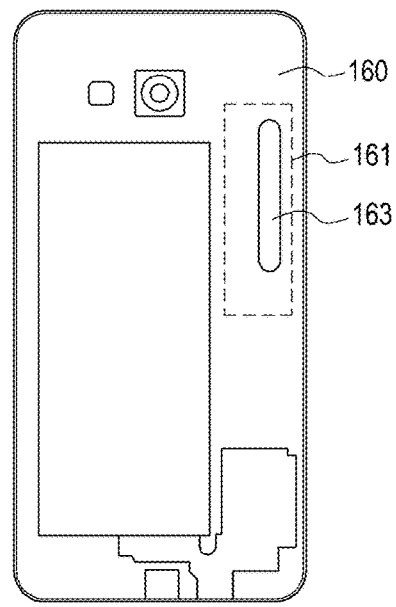
FIG.4A
FIG.4B
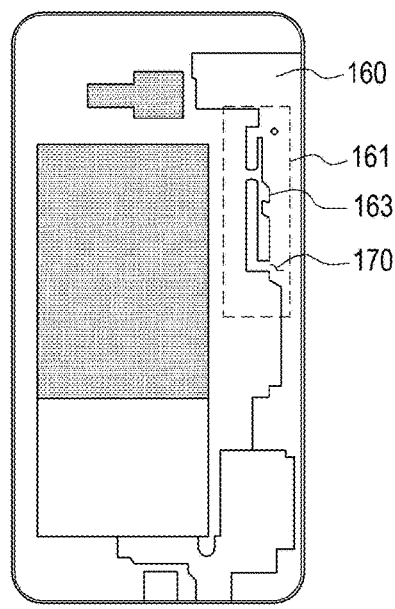
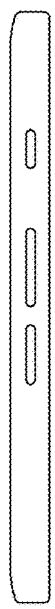
FIG.4C
FIG.4D

ELECTRONIC DEVICE AND METHOD FOR MANUFACTURING THE SAME

CROSS-REFERENCE TO RELATED APPLICATION

This application is based on and claims priority under 35 U.S.C. § 119 to Korean Application Serial No. 10-2015-0169359, which was filed in the Korean Intellectual Property Office on Nov. 30, 2015, the entire content of which is incorporated by reference herein in its entirety.

TECHNICAL FIELD

The present disclosure relates generally to a structure for uniformly diffusing heat to a periphery of a portable electronic device, which is generated in a specific area of a portable electronic device, and further relates to a method for manufacturing the same.

BACKGROUND

Recently, portable terminals having new functions have been quickly developed, and the portable terminals have become an important part in most people's lives with the spread of the same.

In addition, the portable terminals (such as smart phones), which have become common with the development of mobile communication technology, are required to be smaller and lighter in order to maximize the user's portability and convenience, and integrated components are mounted in a smaller space for high-performance.

Accordingly, the heating temperature of the components used in the portable terminal increases due to the high-performance, and the high heating temperature may influence the adjacent components to cause a degradation of the performance of the portable terminal. In addition, the high heating temperature increases the temperature of the outer surface of the portable terminal in order to thereby cause an inconvenience when the user makes a call or manipulates the portable terminal.

A mobile device used in the portable terminal is manufactured to have a structure to diffuse heat by directly attaching a heat radiating sheet to the components that emit heat inside the device. However, such a heat radiating structure comes into direct contact with the components and deteriorates the component performance and fails to effectively diffuse the heat.

SUMMARY

An electronic device, according to the present disclosure, provides an improved heat radiating structure module to improve the unstable heat radiating performance by adopting a simple structure and to effectively diffuse heat depending on the heat-generating components. In addition, a method for manufacturing the same is provided.

According to various example embodiments of the present disclosure, a method for manufacturing an electronic device may include: detecting positions of one or more heat sources disposed in a printed circuit board or in a display of the electronic device, or a path of the heat that is diffused from the heat sources; selecting a heat radiating structure to correspond to the positions of the heat sources or the diffusion path; selecting an adiabatic member or a heat radiating member, which is disposed based on the selected heat radiating structure in order to block (in the case of an adiabatic member) or radiate (in the case of a heat radiating member) the heat transferred from the heat source; and forming the selected heat radiating structure or disposing the selected adiabatic member or heat radiating member on a periphery of the heat source or on the diffusion path.

In addition, the method may further include identifying a change in the heat distribution in the electronic device, which is diffused from the heat sources, based on the adiabatic member or heat radiating member disposed in the heat radiating structure.

In addition, the forming of the heat radiating structure or the disposing of the adiabatic member may include: forming one or more open slits in a side area of a first plate or a second plate, which is disposed above, or under, the printed circuit board; and disposing the adiabatic member of a non-conductive material in the side area including the formed open slit.

In addition, the forming of the heat radiating structure or the disposing of the heat radiating member may include disposing the heat radiating member above the printed circuit board to face the printed circuit board in order to diffuse the heat to the periphery, which is emitted in the first direction, when it is detected that the heat source disposed in the printed circuit board transfers the heat to a display that is directed in the first direction.

In addition, the method may further include forming one or more gap layers on, or under, the heat radiating member to diffuse the heat that is emitted in the first direction.

In addition, the forming of the heat radiating structure or the disposing of the heat radiating member may include disposing the heat radiating member on a lower surface of the display in order to radiate the heat that is emitted to the lower surface of the display when the heat is detected to be transferred from the heat source to the display that is disposed on the upper surface of the device.

In addition, the forming of the heat radiating structure or the disposing of the heat radiating member may include disposing the heat radiating member under the printed circuit board to face the printed circuit board to diffuse the heat to the periphery, which is emitted in the second direction, when it is detected that the heat source disposed in the printed circuit board transfers the heat to a back cover that is directed in the second direction. Furthermore, the method may further include forming one or more gap layers on, or under, the heat radiating member to diffuse the heat that is emitted in the second direction.

In addition, the forming of the heat radiating structure or the disposing of the heat radiating member may include disposing a shield member to surround at least a portion of the heat source, wherein the shield member shields the electromagnetic waves that are generated from the elements and diffuses the generated heat by forming a gap on the heat source.

In addition, the method may further include attaching the heat radiating member onto the shield member, and may further include: forming one or more holes in the shield member; and disposing a heat transfer member to face the holes to transfer the heat in the second direction, which is emitted from the heat source and is headed in the first direction.

According to the method for manufacturing the electronic device, in the selecting of the heat radiating structure, the heat radiating structure may be positioned in the area on which the heat transferred from the heat source is concentrated and which corresponds to at least one of a lateral side, a front side, a back side, or an inner area of the electronic device.

In addition, in the selecting of the heat radiating member, the heat radiating member may be at least one of a heat pipe, a solid heat radiating sheet, or liquid heat radiating paint, which can be disposed in the heat radiating structure.

An electronic device, according to the present disclosure, may include: a first plate directed in the first direction; a second plate directed in the second direction opposite the first direction; a display disposed to be exposed through a portion of the first plate, and that includes one or more heat sources; a printed circuit board disposed in a space between the first plate and the second plate, and that includes one or more heat sources; and an adiabatic or heat radiating member that is disposed to face the heat sources of the printed circuit board or display, or that is disposed to be adjacent to the path of the heat that is emitted from the heat sources to block (in the case of an adiabatic member) or radiate (in the case of a heat radiating member) the heat.

In addition, the electronic device may further include one or more open slits in the side area of the first plate or second plate, wherein the adiabatic member is disposed inside, or outside, the open slit in order to thereby diffuse the heat generated in the side area to the periphery.

According to various example embodiments of the disclosure, the improvement of the heat radiating structure can be maximized and/or increased by improving the structure of a heat diffusion path of the electronic device and by selecting and disposing heat radiating members in appropriate positions.

According to an example embodiment of the present disclosure, the concentration of heat, which is caused by the heat radiation in a specific portion of the outer surface of the electronic device, can be diffused to other portions, thereby effectively enhancing the performance of the product.

According to an example embodiment of the present disclosure, the consumer's needs can be satisfied by implementing the structure to improve the heat radiating area that directly comes into contact with a user's skin in the electronic device that adopts a metal material.

According to an example embodiment of the present disclosure, since the heat radiating structure is implemented in the form of a module for common use, the material cost can be reduced.

BRIEF DESCRIPTION OF THE DRAWINGS

The above and other aspects, features, and advantages of the present disclosure will be more apparent from the following detailed description, taken in conjunction with the accompanying drawings, in which like reference numerals refer to like elements, and wherein:

FIGS. 4A, 4B, 4C and 4D are diagrams sequentially illustrating an example process of improving a heat radiating structure of a printed circuit board, according to various example embodiments of the present disclosure;

DETAILED DESCRIPTION

Figure 1:
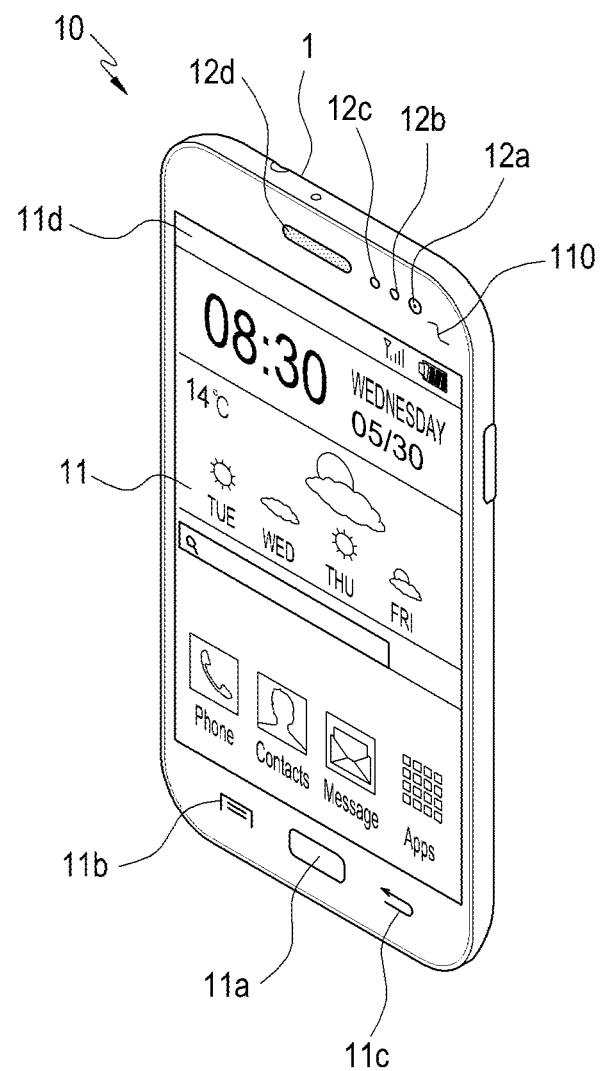
FIG. 1 is a perspective view diagram illustrating a front side of an example electronic device, according to an example embodiment of the present disclosure.

Hereinafter, various example embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device, or the like, but is not limited thereto. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit), or the like, but is not limited thereto.

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame, or the like, but is not limited thereto.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.), or the like, but is not limited thereto.

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter), or the like, but is not limited thereto. In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may further include a new electronic device according to the development of technology.

Hereinafter, an electronic device according to various embodiments will be described with reference to the accompanying drawings. In the present disclosure, the term "user" may indicate a person using an electronic device or a device (e.g., an artificial intelligence electronic device) using an electronic device.

Figure 2:
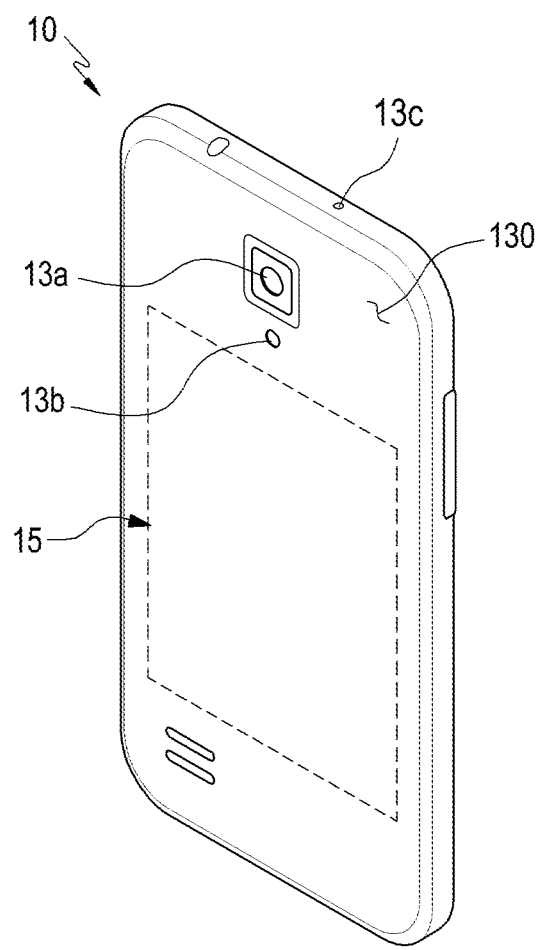
FIG. 2 is a perspective view diagram illustrating a back side of an electronic device, according to an example embodiment of the present disclosure.

FIG. 1 is a perspective view illustrating an example front side of an electronic device. FIG. 2 is a perspective view illustrating the back side of the electronic device. The electronic device 10 may be a smart phone or a wearable device. The components of the electronic device, such as a smart phone, will be described with reference to FIGS. 1 and 2.

As illustrated in FIG. 1, a touch screen 11 may be disposed in the central portion of the front surface of the electronic device 10. The touch screen 11 may occupy most of the front surface of the electronic device 10. FIG. 1 shows an example in which a main home screen is displayed on the touch screen 11. The main home screen may be displayed on the touch screen 11 when the electronic device 10 is turned on. In addition, if the electronic device 10 has a number of different home screen pages, the main home screen may be the first home screen among the home screen pages. The home screen may display icons for executing applications that are frequently used, a main menu switch key, time, or weather. The main menu switch key may display a menu screen on the touch screen 11. In addition, a status bar 11d indicating the status, such as the battery charging status, the intensity of a received signal, or the current time, may be formed at the top end of the touch screen 11. A home key 11a, a menu button 11b, and a back button 11c may be formed below the touch screen 11.

The home key 11a may display the main home screen on the touch screen 11. For example, when the home key 11a is touched while another home screen other than the main home screen or the menu screen is displayed on the touch screen 11, the main home screen may be displayed on the touch screen 11. In addition, when the home key 11a is touched while applications are in progress on the touch screen 11, the main home screen may be displayed on the touch screen 11. In addition, the home key 11a may be used to display the applications that have recently been used, or may be used to display a task manager on the touch screen 11. The menu button 11b may provide connection menus that may be used on the touch screen 11. The connection menus may include a widget addition menu, a wallpaper change menu, a search menu, an edit menu, or a configuration menu. The back button 11c may display the screen that was executed immediately before the current screen, or may terminate the application that has recently been used.

According to various embodiments of the disclosure, as illustrated in FIG. 1 described above, the first camera 12a, an illuminance sensor 12b, or a proximity sensor 12c may be provided in the upper portion of the electronic device 10.

As illustrated in FIG. 2, the second camera 13a, a flash 13b, or a speaker 13c may be provided on the back side of the electronic device 10.

In addition, the heat radiating members used in the present embodiment may be applied to a portable terminal, a refrigerator, and buildings, but the present disclosure is not limited thereto, and the heat radiating members that are used in other industrial fields may be applied to the present disclosure.

Now, the configuration of the heat radiating structure provided in the electronic device 10, according to various embodiments of the present disclosure, will be described in more detail, as follows.

Figure 3:
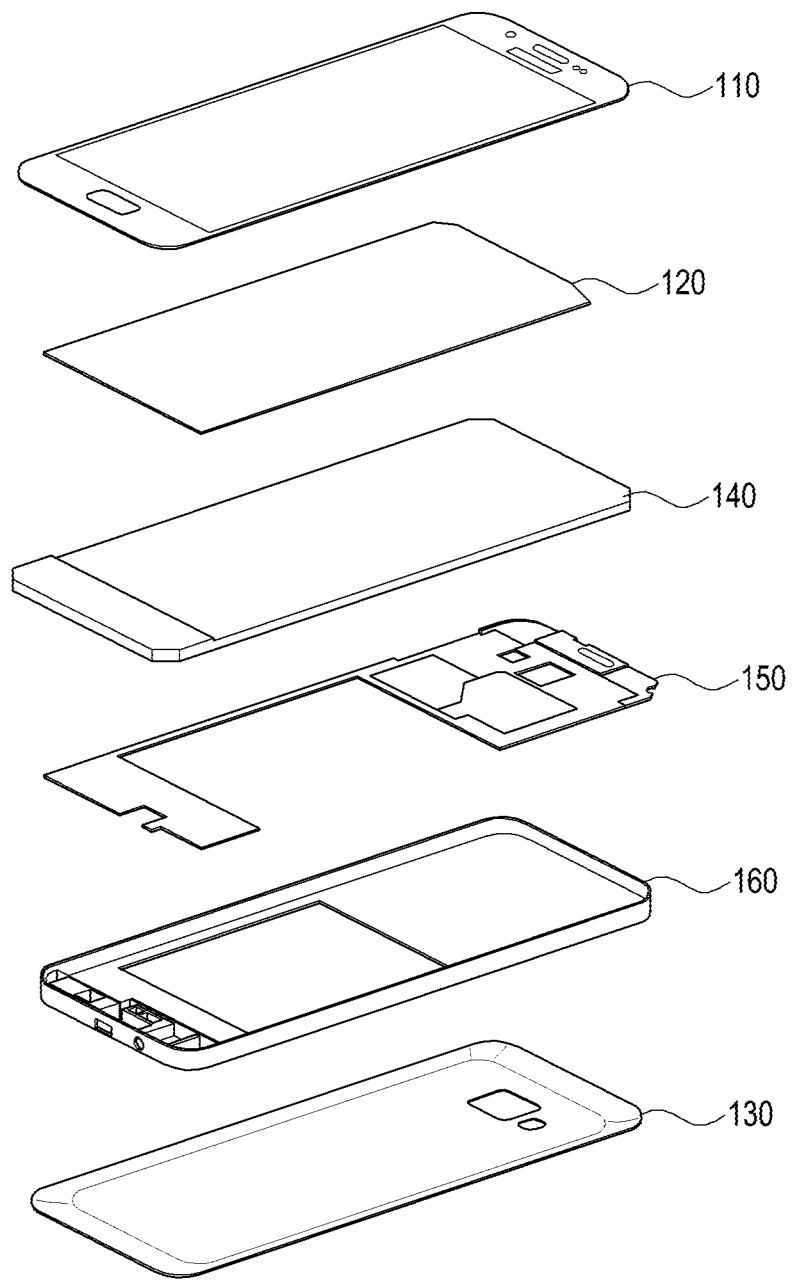
FIG. 3 is an exploded perspective view illustrating an example electronic device, according to various example embodiments of the present disclosure.
Figure 5:
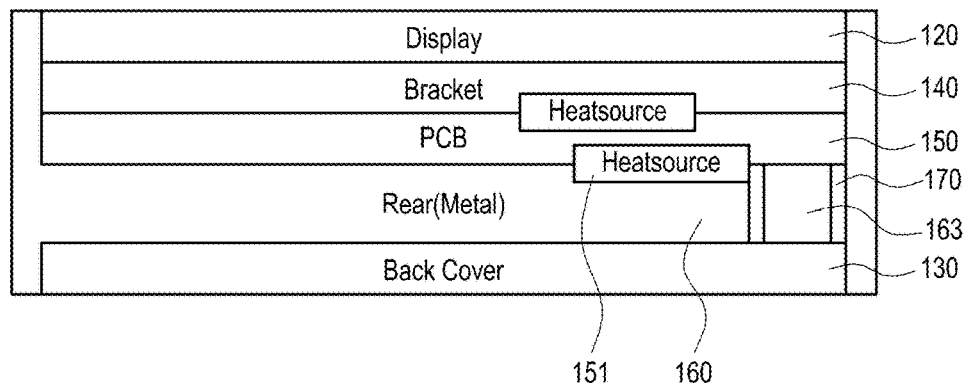
FIGS. 5 and 6 are simplified structural diagrams illustrating the lateral side of the second plate for improving the heat radiation, according to various example embodiments of the present disclosure.

FIG. 3 is an exploded perspective view of the electronic device, according to various embodiments of the present disclosure. FIG. 5 is a simplified side view showing the lateral side of the electronic device, according to various embodiments of the present disclosure.

Referring to FIGS. 3 and 5, the electronic device 10 may include a cover glass 110, a display 120, a first plate 140, a printed circuit board 150, a second plate 160, and a back cover 130.

The cover glass 110 may be disposed in the outermost portion of the front side of the electronic device 10. The cover glass 110 may be made of a reinforced material having a high hardness in order to protect internal components of the electronic device 10 from the external impact, and in order to prevent the scratches on the outer surface. In addition, the cover glass 110 may allow the electronic device 10 to make a good appearance and to be easy on the user's eye.

The electronic device 10 may include the first plate 140 that is directed in the first direction (for example, frontward) and the second plate 160 that is directed in the second direction (for example, rearward), which is opposite to the first direction, under the cover glass 110.

According to an embodiment, the first plate 140 may play the role of receiving and diffusing the heat generated from various heat sources 151 provided in the printed circuit board 150 of the electronic device 10, and the second plate 160 may play the role of fixing the components of the electronic device 10. The first plate 140 may be omitted depending on the type of electronic device 10, and the second plate may be made of a metal or may be made by injection moulding.

According to an embodiment, the first plate 140 and the second plate 160 may be shaped into a flat plate, or may be flexible to have curved portions. In addition to the front side, the outer lateral side of the first plate 140 or second plate 160 may be made to have curved portions to allow the user to easily grasp the electronic device. Therefore, the electronic device 10 including the curved portions may give an effect that the user can easily click on the buttons while comfortably gripping the electronic device 10.

The display 120 may encompass the aforementioned touch screen 11 (see FIG. 1), and may be configured to include a screen area that is exposed through a portion of the first plate 140 in the embodiment of the present disclosure. The display 120 may be made by using organic, inorganic, or natural materials that emit light to display the screen. The configuration of the display 120 will be described later, and the details thereof will be omitted.

The printed circuit board 150 may be positioned between the first plate 140 and the second plate 160, and may include at least one of a central processing unit (CPU), an application processor (AP), or a communication processor (CP). The CPU, AP, or CP is a heat source 151 for generating heat, and may perform a calculation or the data processing for control and/or communication of one or more other components of the electronic device 10. A network between the components disposed in the printed circuit board 150 and a network with other components will be described later.

The back cover 130 is positioned in the outermost surface of the back side of the electronic device 10 to correspond to the cover glass 110, and may play the role of protecting the back portion of the device including a battery. The back cover 130 may be made of a reinforced material having a high hardness in order to protect internal components of the electronic device 10 from the external impact, and in order to minimize the scratches on the outer surface. In addition, like the glass cover 110, the back cover 130 may allow the electronic device 10 to make a good appearance and to be easy on the user's eye.

If the electronic device 10 adopts a detachable battery pack, the back cover 130 (the back surface of the electronic device 10) may be a detachable battery cover 15 (see FIG. 2). The back cover 130 may be implemented to have, at least in part, curved surfaces to allow the user to easily grasp the same.

Hereinafter, the electronic device 10 including the heat radiating member 170 will be described with reference to the additional drawings.

Figure 6:
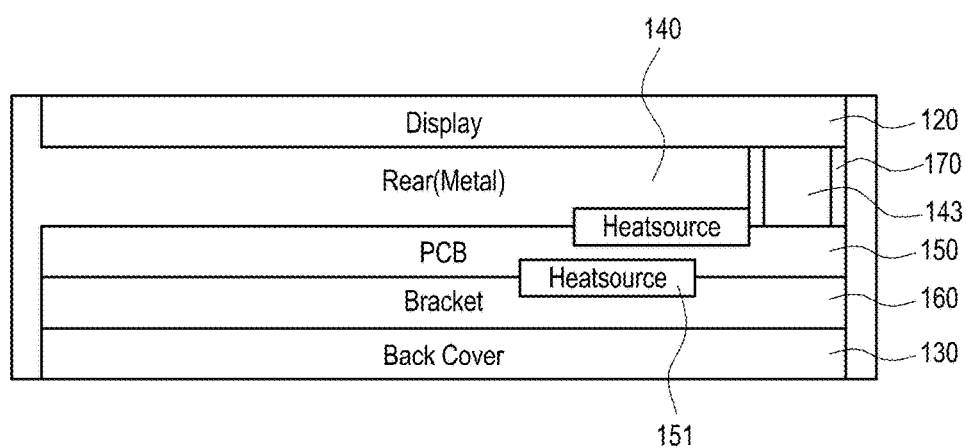

FIGS. 4A-4D are diagrams illustrating the improvement of the heat radiating structure of the printed circuit board, according to various embodiments of the present disclosure. FIGS. 5 and 6 are structural views simply showing the lateral side of the second plate for the improvement of the heat radiation, according to various embodiments of the present disclosure. FIG. 7 illustrates photographs showing the effect of the heat radiation improvement through the structural improvement of FIG. 5 or FIG. 6.

First, Referring to FIGS. 4 and 5, the electronic device 10 may include: a first plate 140 that is directed in the first direction; a second plate 160 that is directed in the second direction, which is opposite to the first direction; a display 120 that is disposed to be exposed through a portion of the first plate; and a printed circuit board 150 that is disposed in a space between the first plate 140 and the second plate 160 and that includes one or more heat sources 151.

In an embodiment, the first plate 140 may include a bracket that is made of a metal or plastic material, and the second plate 160 may include a rear that is made of a metal material to surround the lateral side thereof. In addition, the printed circuit board 150 may include a rigid printed circuit board (PCB) or a flexible printed circuit board (FPCB).

For example, since the second plate 160 made of a metal material has a thermal conductivity, it may facilitate the diffusion of the heat generated from the heat source 151 of the printed circuit board 150 to the side area 161 so that the heat may be excessively concentrated on the side area 161 in order to thereby cause a temperature rise. The side area 161 of the electronic device 10 comes into direct contact with a palm or fingers when the user grips the electronic device 10, so the reduction in the temperature of the side area 161 is required.

Therefore, according to an embodiment of the present disclosure, one or more open slits 163 may be formed in the side area 161 of the second plate 160. An adiabatic member may be put in the open slit 163. In addition, the adiabatic member may block the heat transfer in order to thereby suppress a temperature rise. In addition to the open slit 163, a heat radiating member 170 may be disposed in the side area 161 of the second plate 160. The heat radiating member 170 may be disposed on the upper surface or lower surface of the open slit 163, as well as in the open slit 163. According to the present disclosure, although the open slit 163 is configured to have an elongated oval, the open slit 163 is not limited thereto, and may be designed in various shapes in the area where the heat is generated according to the heat diffusion path. In addition, the heat radiating member 170 may be variously formed with solid sheets or liquid paint in the whole area including the front side and the back side, as well as the side area, in order to radiate heat.

FIG. 4A illustrates the second plate 160 of a metal material before the improvement, wherein the entire area is closed by the metal. In the structure above, the excessive heat is generated in the lateral side of the electronic device 10 in order to thereby cause the degradation of the performance and the user's inconvenience. FIG. 4B illustrates a structure in which the open slit 163 is formed in the side area 161 of the second plate 160, and FIG. 4C illustrates a structure in which an adiabatic member made of a synthetic plastic material, such as PC, is filled into the open slit 163 and its periphery. FIG. 4D illustrates heating points viewed from the side of the electronic device 10.

The heat transfer path to the side area 161 may be blocked or diverted because of the open slit 163 according to the improved structure, and the adiabatic member or the heat radiating member 170 may reduce the heat transfer and may induce the distribution and diffusion of heat in order to thereby lower the temperature of the lateral side of the electronic device 10.

Figure 7A:
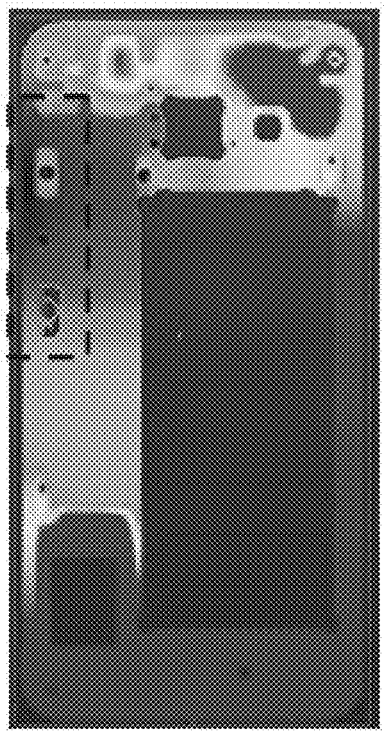
FIGS. 7A and 7B are thermal photographs illustrating thermal distribution showing the effect of the heat radiation improvement through the structural improvement of FIG. 5 or FIG. 6.
Figure 7B:
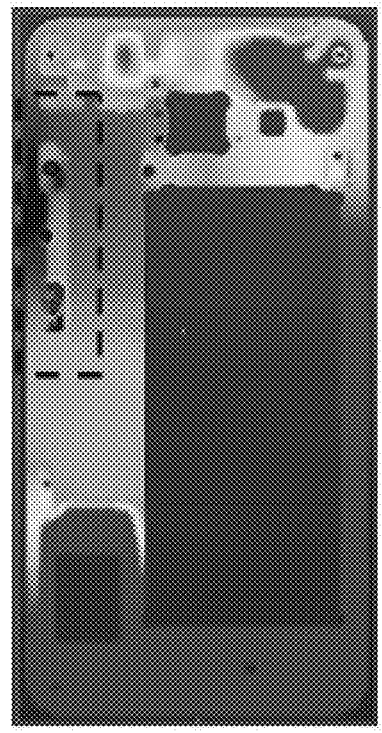

Referring to FIGS. 7A and 7B, FIG. 7A is a thermal distribution diagram/photograph illustrating the heat diffusion effect before the structural improvement, and FIG. 7B is a thermal distribution diagram/photograph illustrating the heat diffusion effect after the structural improvement (here, the red color denotes a high temperature).

Comparing FIGS. 7A and 7B, it can be seen that the heat freely diffuses through the side area 161 before the improvement. It may be confirmed that the temperature of the side area 161 is relatively lowered after the open slit 163 and the adiabatic member are structurally disposed.

According to an embodiment of the present disclosure, the heat generated from the heat sources 151 {that is, a PAM (Power Amplifier Module) and an AP (Application Processor)}, which are positioned in the side area 161 of the electronic device 10, may diffuse through the portions other than the side area 161. In addition, this may solve the heat radiating problem on the lateral side of the electronic device 10, which has been continuously complained about by the user.

FIG. 6 is a simplified diagram illustrating the improved heat radiating structure on the side area of the electronic device, according to another embodiment of the present disclosure.

Referring to FIG. 6, the electronic device 10 may include: a first plate 140 that is directed in the first direction; a second plate 160 that is directed in the second direction, which is opposite to the first direction; a display 120 that is disposed to be exposed through a portion of the first plate; and a printed circuit board 150 that is disposed in a space between the first plate 140 and the second plate 160 and that includes one or more heat sources 151.

According to an embodiment, the first plate 140 may include a bracket that is made of a metal material, and may be configured to surround the side area thereof, and the second plate 160 may include a rear that is made of a metal or plastic material to be disposed in the back side. In addition, the printed circuit board 150 may include a rigid printed circuit board (PCB) or a flexible printed circuit board (FPCB).

According to an embodiment, since the first plate 140 made of a metal material has a thermal conductivity, it may facilitate the diffusion of the heat generated from the heat source 151 of the printed circuit board 150 to the side area so that the heat may be excessively concentrated on the side area in order to thereby cause a temperature rise. Therefore, according to an embodiment of the present disclosure, one or more open slits 143 may be formed in the side area of the first plate 140. An adiabatic member may be put in the open slit 143. The adiabatic member may block the heat transfer in order to thereby suppress a temperature rise. In addition to the open slit 143, a heat radiating member 170 may be disposed in the side area of the first plate 140. The heat radiating member 170 may be disposed on the upper surface or lower surface of the open slit 143, as well as in the open slit 143. According to the present disclosure, although the open slit 143 is shape into an elongated oval, the open slit 143 is not limited thereto, and may be designed in various shapes in the area where the heat is generated according to the heat diffusion path. In addition, the heat radiating member 170 may be variously formed with solid sheets or liquid paint in the whole area including the front side and the back side, as well as the side area, in order to radiate heat.

Through the present embodiment, since the diffusion path of the heat that is generated in the side area of the electronic device 10 may be diverted to the periphery, the user may conveniently use the electronic device 10. The detailed description thereof is the same as in the embodiment above, so it will be omitted.

Figure 8:
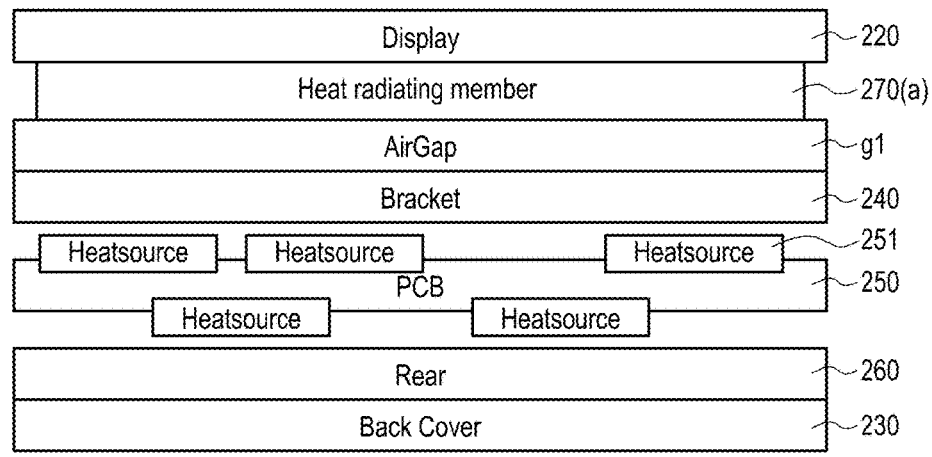
FIGS. 8 to 11 are simplified structural diagrams illustrating an example heat radiating structure for improving the heat radiation of the front side of the electronic device, according to various example embodiments of the present disclosure.

FIG. 8 is a diagram illustrating the heat radiating structure for improving the heat radiation in the front side of the electronic device, according to various embodiments of the present disclosure.

Referring to FIG. 8, the electronic device 10 may include: a first plate 240 that is directed in the first direction; a second plate 260 that is directed in the second direction, which is opposite to the first direction; a display 220 that is disposed to be exposed through a portion of the first plate; and a printed circuit board 250 that is disposed in a space between the first plate 240 and the second plate 260 and that includes one or more heat sources 251. In addition, the electronic device 10 may further include a back cover 230 that is disposed in the lower portion of the second plate 260, and that protects the electronic device 10 from the external impact applied from the rear.

In an embodiment, the first plate 240 may include a bracket that is made of a metal or plastic material, and the second plate 260 may include a rear that is made of a metal or plastic material. In addition, the printed circuit board 250 may include a rigid printed circuit board (PCB) or a flexible printed circuit board (FPCB).

One or more heat sources 251 that are disposed in the printed circuit board 250 of the electronic device 10 may emit heat according to the driving of the circuit so that the heat may diffuse in the first direction. In addition, the heat source 251 disposed on the back side of the printed circuit board 250 may be driven so that the heat may diffuse in the second direction. According to this, since the heat may be excessively concentrated on the display 220 that is disposed in the front side of the electronic device 10, the heat radiating member 270 for dispersing the heat diffusion path is required to be disposed on the periphery of the display 220 in order to suppress the same. In addition, since the heat may be excessively concentrated on the back cover 230 that is disposed in the back side of the electronic device 10, the heat radiating member 270 for dispersing the heat diffusion path is required to be disposed on the periphery of the back cover 230 in order to suppress the same.

First of all, a structure to improve the heat radiation of a specific area (e.g., the display) of the first direction will be provided.

The first heat radiating member 270(a) is interposed between the display 220 and the first plate 240 to radiate the heat that is generated in the heat source 251 disposed in the printed circuit board 250 and that is transferred in the first direction. For example, the heat source 251 of the printed circuit board 250 may be one or more chips that are disposed on the printed circuit board 250, and may include a PMIC, a PAM, an AP, a CP, and the like.

In addition, the first heat radiating member 270(a), for example, may include a heat pipe, a solid heat radiating sheet, or liquid heat radiating paint. Here, the heat pipe, the solid heat radiating sheet, or the liquid heat radiating paint may include high-thermal conductive materials, such as graphite, carbon nanotubes, natural recycled materials, or silicon.

The first heat radiating member 270(a) may be disposed to be in contact with the display 220 while facing the same, and may be disposed to be spaced a predetermined gap from the first plate 240 while facing the same. The first planar gap layer (g1) including the gap may be positioned in one side of the first heat radiating member 270(a) in order to induce the initial diffusion of the heat, which is emitted from the heat source 251, through the first gap layer (g1) without the heat directly passing through the first heat radiating member 270(a). Therefore, the heat may be evenly distributed through the entire surface of the first heat radiating member 270(a) according to the initial diffusion, and may then reach the first heat radiating member 270(a) in order to thereby maximize the diffusion effect.

In addition, the first plate 240 may include a metal material, and may, for example, include Al or Mg. Since the metal material has a thermal diffusion property, additional heat distribution may be possible.

Therefore, according to the present embodiment, the heat that is diffused from the heat source 251 of the printed circuit board 250 may reach the display 220 through the first plate 240, the first gap layer (g1), and the first heat radiating member 270(a). The initial diffusion of the heat may be made through the first plate 240, and the heat may be further diffused by passing through the first gap layer (g1) and the first heat radiating member 270(a). In particular, the first heat radiating member 270(a) may effectively distribute the heat path to the display 220 that is placed in the first direction of the heat source 251 so that the temperature of a specific area in the display 220 may be substantially and significantly lowered.

The front area of the electronic device 10 essentially requires the reduction in the temperature because the touch screen thereof directly comes into contact with the fingers or a face when the user uses the electronic device 10 for a phone-call.

The disposition of the first heat radiating member 270(a) and the first gap layer (g1) in the electronic device 10 according to the heat radiation improvement structure may result in the reduction in the heat radiation in the portion that comes into contact with the user's face. This may give an effect to solve the outstanding problem of the heat radiation, which has been continuously complained about by the user of the electronic device 10.

Figure 9:
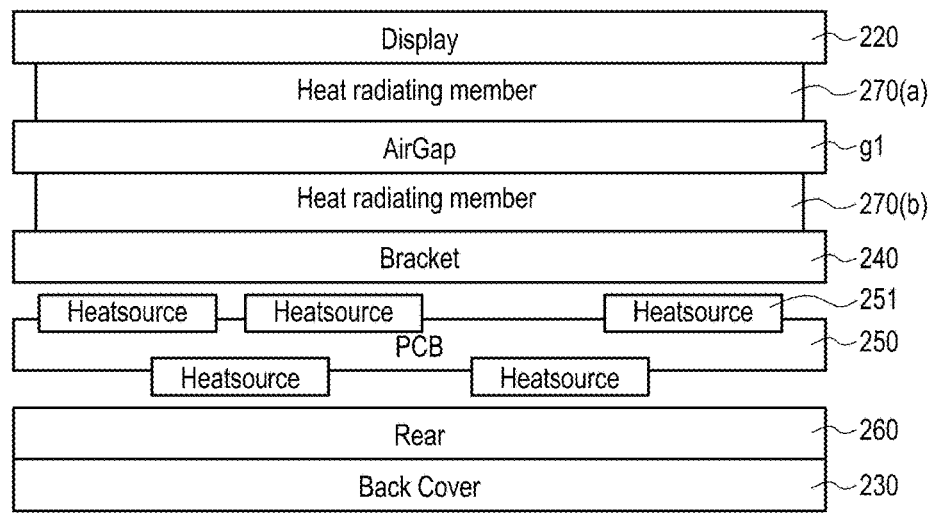

FIG. 9 is a diagram illustrating the heat radiating structure for improving the heat radiation in the front side of the electronic device, according to another embodiment of the present disclosure.

Referring to FIG. 9, the electronic device 10 may include: a first plate 240 that is directed in the first direction; a second plate 260 that is directed in the second direction, which is opposite to the first direction; a display 220 that is disposed to be exposed through a portion of the first plate; and a printed circuit board 250 that is disposed in a space between the first plate 240 and the second plate 260 and that includes one or more heat sources 251. In addition, the electronic device 10 may further include a back cover 230 that is disposed in the lower portion of the second plate 260, and that protects the electronic device 10 from the external impact that is applied from the rear.

In an embodiment, the first plate 240 may include a bracket that is made of a metal or plastic material, and the second plate 260 may include a rear that is made of a metal or plastic material. In addition, the printed circuit board 250 may include a rigid printed circuit board (PCB) or a flexible printed circuit board (FPCB).

According to the present embodiment, a plurality of heat radiating members 270 may be disposed inside the electronic device 10.

With regard to the heat radiating member 270, the first heat radiating member 270(a) and the second heat radiating member 270(b) are interposed between the display 220 and the first plate 240 in order to thereby radiate the heat that is transferred in the first direction from the heat source 251 on the printed circuit board 250. For example, the heat source 251 of the printed circuit board 250 may be one or more chips that are disposed on the printed circuit board 250, and may include a PMIC (Power Management IC), a PAM (Power Amplifier Module), an AP (Application Processor), a CP (Communication Processor), and the like.

In addition, the first heat radiating member 270(a) and the second heat radiating member 270(b), for example, may include heat pipes, solid heat radiating sheets, or liquid heat radiating paint. Here, the heat pipe, the solid heat radiating sheet, or the liquid heat radiating paint may include high thermal conductive materials, such as graphite, carbon nanotubes, natural recycled materials, or silicon.

The first heat radiating member 270(a) may be disposed to be in contact with the display 220 while facing the same, and may be disposed to be spaced a predetermined gap from the second heat radiating member 270(b) while facing the same. The first planar gap layer (g1) including the gap may be positioned in one side of the first heat radiating member 270(a) and the second heat radiating member 270(b) so that the heat that is diffused from the heat source 251 may be evenly distributed through the entire surface of the first heat radiating member 270(a) by the diffusion through the first gap layer (g1), and may then reach the first heat radiating member 270(a) in order to thereby maximize the diffusion effect.

The second heat radiating member 270(b) may be disposed to face the first heat radiating member 270(a) while the first gap layer (g1) is interposed therebetween, and may be disposed to be in contact with the first plate 240. In addition, the first plate 240 may include a metal material, and may, for example, include Al or Mg. Since the metal material has a thermal diffusion property, additional heat distribution may be possible.

Therefore, according to the present embodiment, the heat that is diffused from the heat source 251 of the printed circuit board 250 may reach the display 220 through the first plate 240, the first heat radiating member 270(a), the first gap layer (g1), and the second heat radiating member 270(b). The initial diffusion of the heat may be made through the first plate 240 made of a metal material, and the heat may be further diffused by passing through the first gap layer (g1) and the first and second heat radiating members 270(a) and 270(b). In particular, the first heat radiating member 270(a) and the second heat radiating member 270(b) may effectively distribute the heat path to the display 220 that is positioned in the first direction of the heat source 251 so that the temperature of a specific area in the display 220 may be substantially and significantly lowered.

According to an embodiment, although only a single layer of the second heat radiating member 270(b) is configured in the front side of the first plate 240, a plurality of layers of the second heat radiating members 270(b) may be disposed on the heat source 251 to correspond to the size of heat source 251.

The front area of the electronic device 10 essentially requires the reduction in the temperature because the touch screen thereof directly comes into contact with the user's fingers or face when the user uses the electronic device 10 for a phone-call. The disposition of the first heat radiating member 270(a), the second heat radiating member 270(b), and the first gap (g1) in the electronic device 10 according to the heat radiation improvement structure may result in the reduction in the heat radiation in the portion that comes into contact with the user's skin. This may give an effect to solve the outstanding problem of the heat radiation, which has been continuously complained about by the user of the electronic device 10.

Figure 10:
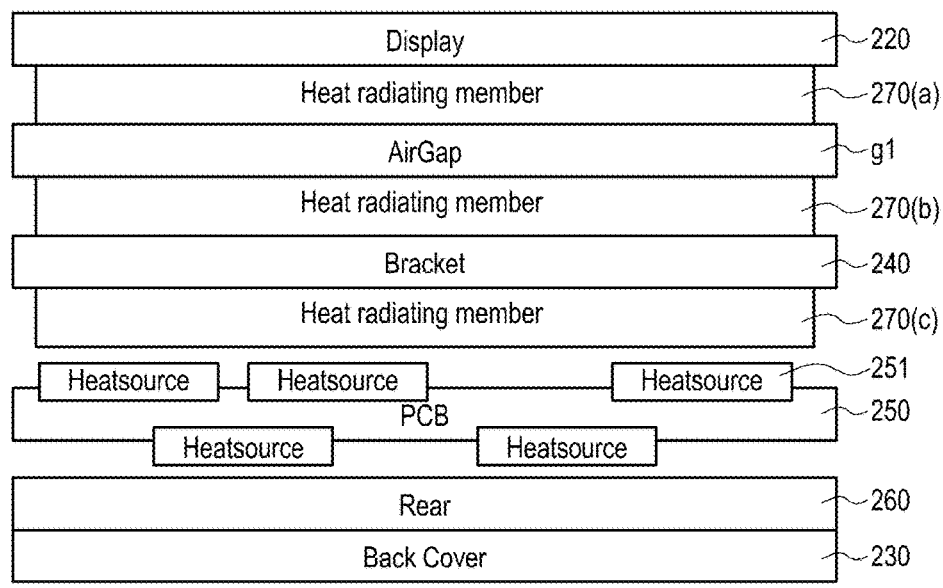

FIG. 10 is a diagram illustrating a heat radiating structure for improving the heat radiation of the front side of the electronic device, according to another embodiment of the present disclosure.

Referring to FIG. 10, the electronic device 10 may include: a first plate 240 that is directed in the first direction; a second plate 260 that is directed in the second direction, which is opposite to the first direction; a display 220 that is disposed to be exposed through a portion of the first plate; and a printed circuit board 250 that is disposed in a space between the first plate 240 and the second plate 260 and that includes one or more heat sources 251. In addition, the electronic device 10 may further include a back cover 230 that is disposed in the lower portion of the second plate 260, and that protects the electronic device 10 from the external impact that is applied from the rear.

According to the present embodiment, a plurality of heat radiating members 270 may be disposed inside the electronic device 10. With regard to the heat radiating member 270, the first heat radiating member 270(a), the second heat radiating member 270(b), and the third heat radiating member 270(c) are interposed between the display 220 and the printed circuit board 250 in order to thereby radiate the heat that is transferred in the first direction from the heat sources 251 on the printed circuit board 250. For example, the heat sources 251 of the printed circuit board 250 may be one or more chips that are disposed on the printed circuit board 250, and may include a PMIC, a PAM, an AP, a CP, and the like.

In addition, the first heat radiating member 270(a), the second heat radiating member 270(b), and the third heat radiating member 270(c), for example, may include heat pipes, solid heat radiating sheets, or liquid heat radiating paint. Here, the heat pipe, the solid heat radiating sheet, or the liquid heat radiating paint may include high thermal conductive materials, such as graphite, carbon nanotubes, natural recycled materials, or silicon.

The first heat radiating member 270(a) may be disposed to be in contact with the display 220 while facing the same, and may be disposed to be spaced a predetermined gap from the second heat radiating member 270(b) while facing the same. The first planar gap layer (g1) including the gap is positioned in one side of the first heat radiating member 270(a) and the second heat radiating member 270(b) so that the heat that is diffused from the heat source 251 may be evenly distributed through the entire surface of the first heat radiating member 270(a) by the diffusion through the first gap layer (g1), and may then reach the first heat radiating member 270(a) in order to thereby maximize the diffusion effect.

The second heat radiating member 270(b) may be disposed to face the first heat radiating member 270(a) while the first gap layer (g1) is interposed therebetween, and may be disposed to be in contact with the first plate 240. In addition, the first plate 240 may include a metal material, and may, for example, include Al or Mg. Since the metal material has a thermal diffusion property, additional heat distribution may be possible.

The third heat radiating member 270(c) may be disposed in parallel to the first heat radiating member 270(a) and the second heat radiating member 270(b), and may be disposed to face the printed circuit board 250. For example, the third heat radiating member 270(c) may be disposed such that one side thereof comes into contact with the first plate 240 and the other side thereof is spaced a predetermined gap from the printed circuit board 250. In the present embodiment, although the third heat radiating member 270(c) is illustrated to face the entire front side of the printed circuit board 250 in parallel thereto, the present disclosure is not limited thereto, and a plurality of third heat radiating members 270(*c*) having sizes corresponding to the sizes of the heat sources 251 may be disposed above the heat sources 251 of the printed circuit board 250.

According to the present embodiment, the heat that is diffused from the heat source 251 of the printed circuit board 250 may reach the display 220 through the third heat radiating member 270(*c*), the first plate 240, the second heat radiating member 270(*b*), the first gap (g1), and the first heat radiating member 270(*a*). The heat from the heat source 251 may be initially diffused by the third heat radiating member 270(*c*), and may then be further diffused through the first plate 240 that is made of a metal material. In addition, the heat may be further diffused through the second heat radiating member 270(*b*), the first gap (g1), and the first heat radiating member 270(*a*). In particular, the first heat radiating member 270(*a*), the second heat radiating member 270(*b*), and the third heat radiating member 270(*c*) may effectively distribute the heat path to the display 220 that is placed in the first direction of the heat source 251 so that the temperature of a specific area in the display 220 may be substantially and significantly lowered.

The front area of the electronic device 10 essentially requires the reduction in the temperature because the touch screen thereof directly comes into contact with the fingers or a face when the user uses the electronic device 10 for a phone-call. The disposition of the first heat radiating member 270(*a*), the second heat radiating member 270(*b*), the third heat radiating member 270(*c*), and the first gap (g1) in the electronic device 10 according to the heat radiating improvement structure may result in the reduction in the heat radiation in the portion that comes into contact with the user's skin. This may give an effect to solve the outstanding problem of the heat radiation, which has been continuously complained about by the user of the electronic device 10.

Figure 11:
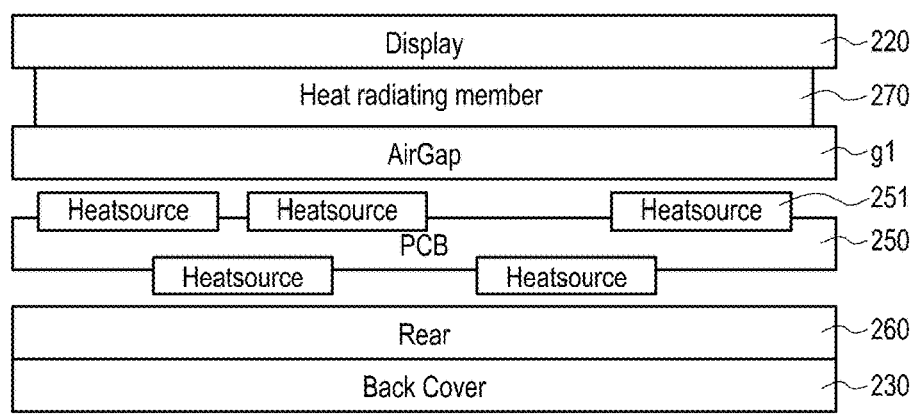

FIG. 11 is a diagram illustrating a heat radiating structure for improving the heat radiation of the front side of the electronic device, according to another embodiment of the present disclosure.

Referring to FIG. 11, unlike the embodiments above, the electronic device 10 is designed to have a structure that does not adopt the first plate. Therefore, the display 220, the first heat radiating member 270, the first gap layer (g1), the printed circuit board 250 including one or more heat sources 251, the second plate 260, and the back cover 230 are stacked in sequence from the top.

According to the present embodiment, the first heat radiating member 270 may be disposed in order to disperse the heat that is emitted from the heat source 251 of the printed circuit board 250 in the first direction (that is, frontward) and that is concentrated on the display 220.

The first heat radiating member 270 may be disposed between the display 220 and the printed circuit board 250, and may play the role of radiating the heat that is transferred in the first direction from the heat source 251 on the printed circuit board 250. The first heat radiating member 270 may be disposed face to face with the display 220, and may be disposed to be spaced a predetermined gap from the printed circuit board 250 while facing the same. The first gap layer (g1) between the first heat radiating member 270 and the printed circuit board 250 is intended to initially diffuse the heat transferred from the heat source 251 to be evenly distributed through the entire surface of the first heat radiating member 270 to then reach the first heat radiating member 270(*a*) in order to thereby maximize the diffusion effect. The detailed description thereof is the same as in the embodiment of FIG. 9, so it will be omitted.

According to FIGS. 8 to 11 described above, the structure for improving the heat radiation from the front side of the electronic device 10 has been described, and a structure for improving the heat radiation from the back side of the electronic device 10 will be described below with reference to FIGS. 12 and 13.

Figure 12:
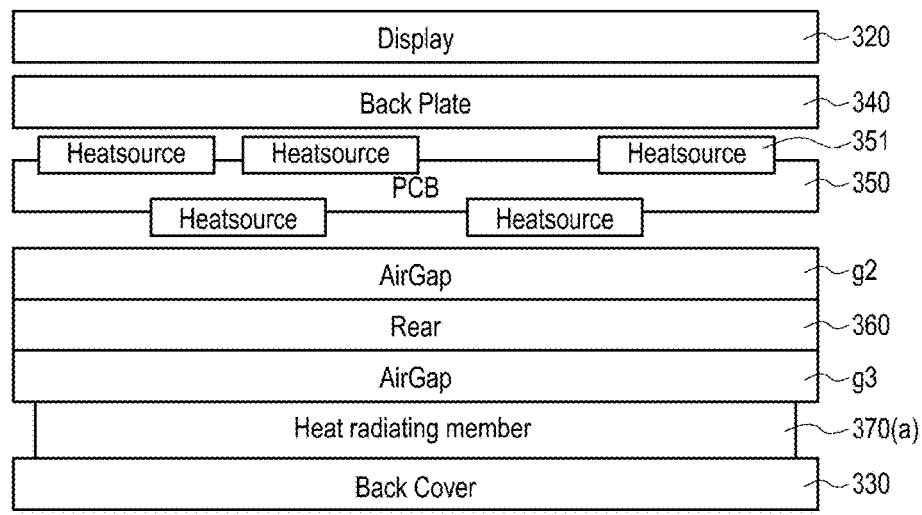
FIGS. 12 and 13 are simplified structural diagrams illustrating an example heat radiating structure for improving the heat radiation of the back side of the electronic device, according to various example embodiments of the present disclosure.

FIG. 12 is a diagram illustrating a structure for improving the heat radiation from the back side of the electronic device, according to various embodiments of the present disclosure.

Referring to FIG. 12, the electronic device 10 may include: a first plate 340 that is directed in the first direction; a second plate 360 that is directed in the second direction, which is opposite to the first direction; a display 320 that is disposed to be exposed through a portion of the first plate; and a printed circuit board 350 that is disposed in a space between the first plate 340 and the second plate 360 and that includes one or more heat sources 351. In addition, the electronic device 10 may further include a back cover 330 that is disposed in the lower portion of the second plate 360, and that protects the electronic device 10 from the external impact that is applied from the rear.

In an embodiment, the first plate 340 may include a bracket that is made of a metal or plastic material, and the second plate 360 may include a rear that is made of a metal material surround the side area. In addition, the printed circuit board 350 may include a rigid printed circuit board (PCB) or a flexible printed circuit board (FPCB).

Among the one or more heat sources 351 that are disposed on the printed circuit board 350 of the electronic device 10, the heat sources 351 that are disposed on the back side thereof may be driven according to the driving of the circuit in order to thereby emit heat in the second direction.

Thus, the fourth heat radiating member 370(*a*) of the present embodiment may be interposed between the second plate 360 and the back cover 330 in order to thereby radiate the heat that is generated from the heat sources 351 on the lower portion of the printed circuit board 350 to then be diffused in the second direction. For example, the heat sources 251 of the printed circuit board 350 may be one or more chips that are disposed on the printed circuit board 350, and may include a PMIC, a PAM, an AP, a CP, and the like.

In addition, the fourth heat radiating member 370(*a*), for example, may include a heat pipe, a solid heat radiating sheet, or liquid heat radiating paint. Here, the heat pipe, the solid heat radiating sheet, or the liquid heat radiating paint may include high thermal conductive materials, such as graphite, carbon nanotubes, natural recycled materials, or silicon.

The fourth heat radiating member 370(*a*) may be disposed to be in contact with the back cover 330 while facing the same, and may be disposed to be spaced a predetermined gap from the second plate 360 while facing the same. The third planar gap layer (g3) including the gap may be positioned in one side of the fourth heat radiating member 370(*a*) in order to induce the initial diffusion of the heat, which is transferred from the heat sources 351, through the third gap layer (g3) without the heat directly passing through the fourth heat radiating member 370(*a*). Therefore, the heat may be evenly distributed through the entire surface of the fourth heat radiating member 370(*a*) according to the initial diffusion, and may then reach to the fourth heat radiating member 370(*a*) in order to thereby maximize the diffusion effect.

According to the present embodiment, the second plate 360 may include a metal material, and may, for example, include Al or Mg. Since the metal material has a thermal diffusion property, additional heat distribution may be possible. In addition, the second gap layer (g2) may be provided between the second plate 360 and the heat sources 351 of the printed circuit board 350 in order to further distribute the heat.

Therefore, according to the present embodiment, the heat that is diffused from the heat sources 351 of the printed circuit board 350 may reach the back cover 330 through the second gap layer (g2), the second plate 360, the third gap layer (g3), and the fourth heat radiating member 370(a). The initial diffusion of the heat may be made through the second gap layer (g2), and the heat may be further diffused by passing through the second plate 360 that is made of a metal material, the third gap layer (g3), and the fourth heat radiating member 370(a). In particular, the fourth heat radiating member 370(a) may effectively distribute the heat path to the back cover 330 that is placed in the second direction of the heat source 351 so that the temperature of a specific area in the back cover 330 may be substantially and significantly lowered.

The back side of the electronic device 10 essentially requires the reduction in the temperature because the back side thereof is directly held by a hand while being in contact with the hand when the user uses the electronic device 10. The improvement structure (i.e., the heat radiating member and the gap layer) in the electronic device 10 may result in the reduction in the heat radiation in the portion that comes into contact with the user's skin. This may give an effect to solve the outstanding problem of the heat radiation, which has been continuously complained about by the user of the electronic device 10.

Figure 13:
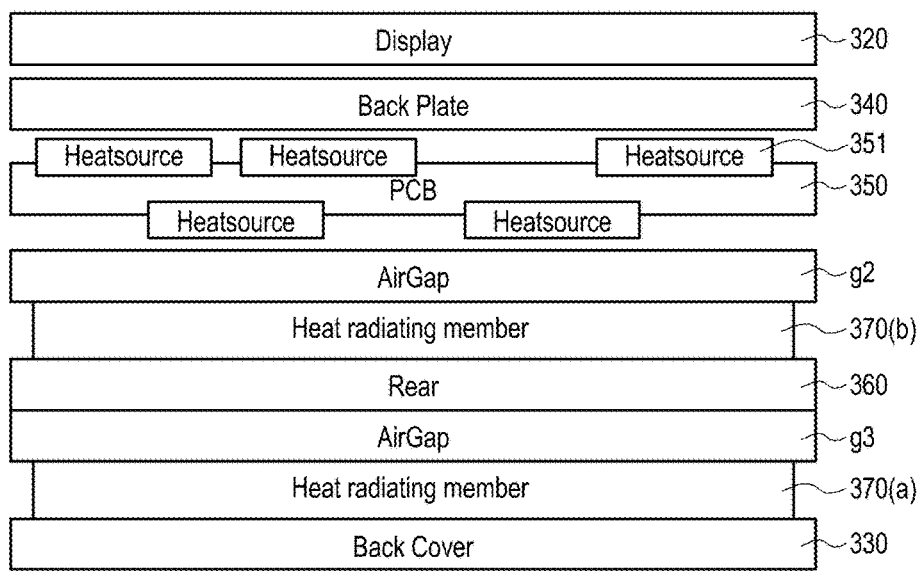

FIG. 13 is a diagram illustrating a structure for improving the heat radiation from the back side of the electronic device, according to another embodiment of the present disclosure.

Referring to FIG. 13, the electronic device 10 may include: a first plate 340 that is directed in the first direction; a second plate 360 that is directed in the second direction, which is opposite to the first direction; a display 320 that is disposed to be exposed through a portion of the first plate; and a printed circuit board 350 that is disposed in a space between the first plate 340 and the second plate 360 and that includes one or more heat sources 351. In addition, the electronic device 10 may further include a back cover 330 that is disposed in the lower portion of the second plate 360, and that protects the electronic device 10 from the external impact that is applied from the rear.

In an embodiment, the first plate 340 may include a bracket that is made of a metal or plastic material, and the second plate 360 may include a rear that is made of a metal material to surround the side area. In addition, the printed circuit board 350 may include a rigid printed circuit board (PCB) or a flexible printed circuit board (FPCB).

Among the one or more heat sources 351 that are disposed on the printed circuit board 350 of the electronic device 10, the heat sources 351 that are disposed on the back side thereof may be driven according to the driving of the circuit in order to thereby emit heat in the second direction.

According to the present embodiment, a plurality of heat radiating members may be disposed inside the electronic device 10. The fourth heat radiating member 370(a) is disposed between the second plate 360 and the back cover 330, and the fifth heat radiating member 370(b) is disposed between the printed circuit board 350 and the second plate 360 in order to thereby sequentially radiate the heat that is generated from the heat sources 351 in the lower portion of the printed circuit board 350 to then be transferred in the second direction. For example, the heat sources 351 of the printed circuit board 350 may be one or more chips that are disposed on the printed circuit board 350, and may include a PMIC, a PAM, an AP, a CP, and the like.

In addition, the fourth heat radiating member 370(a) and the fifth heat radiating member 370(b), for example, may include heat pipes, solid heat radiating sheets, or liquid heat radiating paint. Here, the heat pipe, the solid heat radiating sheet, or the liquid heat radiating paint may include high thermal conductive materials, such as graphite, carbon nanotubes, natural recycled materials, or silicon.

The fourth heat radiating member 370(a) may be disposed to be in contact with the back cover 330 while facing the same, and may be disposed to be spaced a predetermined gap from the second plate 360 while facing the same. The third planar gap layer (g3) including the gap may be positioned in one side of the fourth heat radiating member 370(a) in order to induce the initial diffusion of the heat, which is transferred from the heat sources 351, through the third gap layer (g3) without the heat directly passing through the fourth heat radiating member 370(a). Therefore, the heat may be evenly distributed through the entire surface of the fourth heat radiating member 370(a) according to the initial diffusion, and may then reach the fourth heat radiating member 370(a) in order to thereby maximize the diffusion effect.

The fifth heat radiating member 370(b) may be disposed in parallel to the fourth heat radiating member 370(a), and may be disposed to be spaced a predetermined gap from the printed circuit board 350 while facing the same. For example, the fifth heat radiating member 370(b) may be disposed such that one side thereof comes into contact with the second plate 360 and the other side thereof is spaced a predetermined gap from the printed circuit board 350. In the present embodiment, although the fifth heat radiating member 370(b) is illustrated to face the entire front area of the printed circuit board 350 in parallel thereto, the present disclosure is not limited thereto, and a plurality of fifth heat radiating members having sizes corresponding to the sizes of the heat sources 351 may be disposed under the heat sources 351 of the printed circuit board 350.

In addition, the second plate 360 may include a metal material, and may, for example, include Al or Mg. Since the metal material has a thermal diffusion property, additional heat distribution may be possible.

Therefore, according to the present embodiment, the heat that is diffused from the heat sources 351 of the printed circuit board 350 may reach the back cover 330 through the second gap layer (g2), the fifth heat radiating member 370(b), the second plate 360, the third gap layer (g3), and the fourth heat radiating member 370(a). The initial diffusion of the heat may be made through the second gap layer (g2), and the heat may be further diffused by passing through the fifth heat radiating member 370(b), the second plate 360 made of a metal material, the third gap layer (g3), and the fourth heat radiating member 370(a). In particular, the fourth heat radiating member 370(a) and the fifth heat radiating member 370(b) may effectively distribute the heat path to the back cover 330 that is placed in the second direction of the heat source 351 so that the temperature of a specific area in the back cover 330 may be substantially and significantly lowered.

The back side of the electronic device 10 essentially requires the reduction in the temperature because the back side thereof is directly held by a hand while being in contact with the hand when the user uses the electronic device 10. The improvement structure (i.e., the heat radiating member and the gap layer) in the electronic device 10 may result in the reduction in the heat radiation in the portion that comes into contact with the user's skin. This may give an effect to solve the outstanding problem of the heat radiation, which has been continuously complained about by the user of the electronic device 10.

Figure 14:
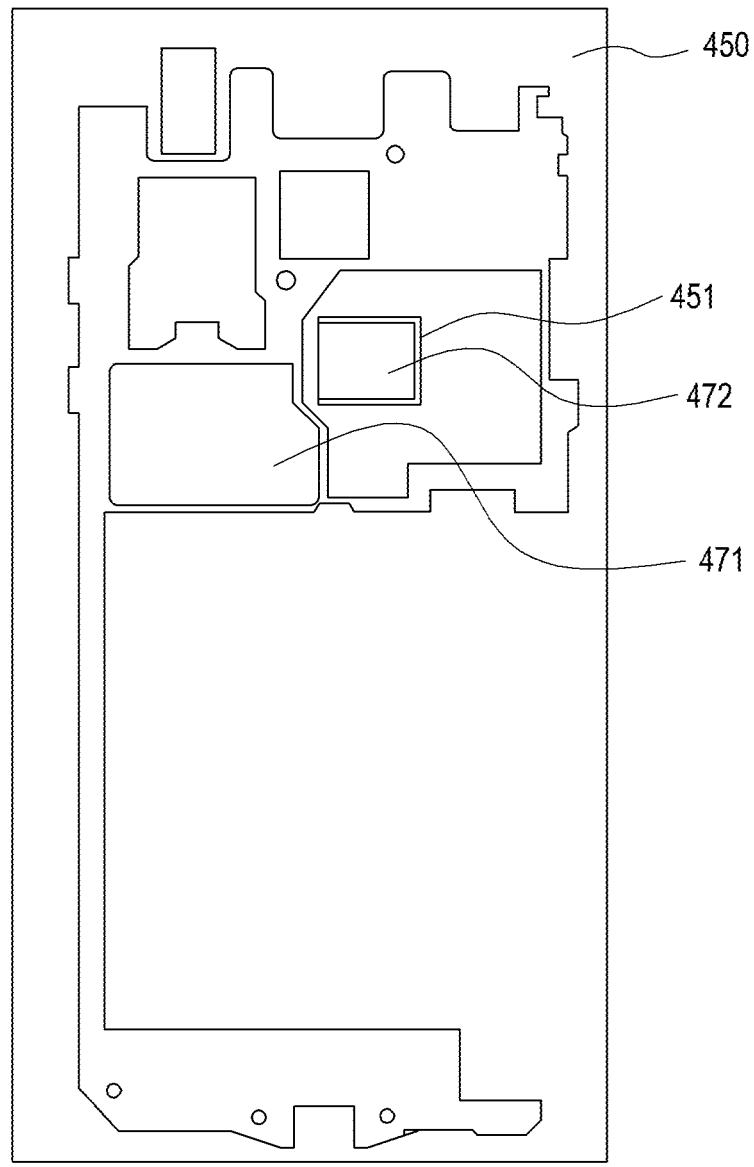
FIG. 14 is a front view illustrating an example printed circuit board, according to various example embodiments of the present disclosure.
Figure 15:
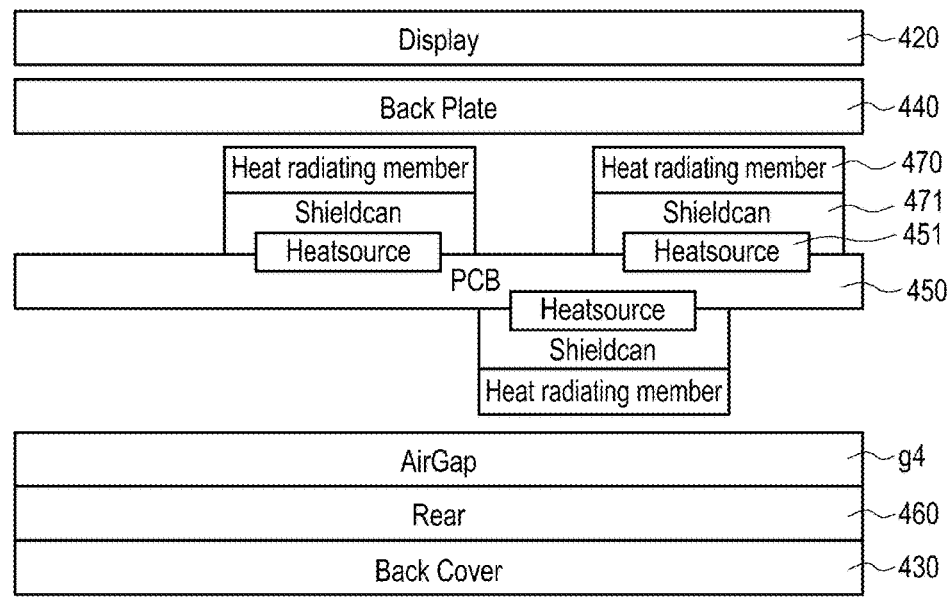
FIG. 15 is a simplified structural side view diagram illustrating example heat radiating members that are disposed in the heat sources of the printed circuit board, according to various example embodiments of the present disclosure.

FIG. 14 is a diagram illustrating a front view of a printed circuit board, according to various embodiments of the present disclosure. FIG. 15 is a side view illustrating heat radiating members that are disposed in the heat sources of the printed circuit board, according to various embodiments of the present disclosure;

Referring to FIG. 14, heat sources 451, shield members 471 that include a shield can 472 or a shield film, and heat transfer members may be provided on the upper and lower sides of the printed circuit board 450.

The heat source 451 is a key element for driving the electronic device 10 and processing a calculation, which generates heat. The heat sources 451 of the printed circuit board 450 may be one or more chips that are disposed on the printed circuit board 450, and may include a PMIC, a PAM, an AP, a CP, and the like. The shield member 471 includes a shield can 472 or a shield film, and is disposed to surround the heat sources 451 in order to thereby improve the RF performance. For example, the shield can 472 may be made of a SUS material. The heat transfer members may be placed on the heat sources 451 to be used to transfer and radiate heat. The heat transfer member may include a heat transfer material, such as a TIM (Thermal Interface Material), a PCM (Phase Change Material), or the like.

Referring to FIG. 15, the electronic device 10 may include: a first plate 440 that is directed in the first direction; a second plate 460 that is directed in the second direction, which is opposite to the first direction; a display 420 that is disposed to be exposed through a portion of the first plate; and a printed circuit board 450 that is disposed in a space between the first plate 440 and the second plate 460 and that includes one or more heat sources 451. In addition, the electronic device 10 may further include a back cover 430 that is disposed in the lower portion of the second plate 460, and that protects the electronic device 10 from the external impact that is applied from the rear.

Among the one or more heat sources 451 that are disposed on the printed circuit board 450 of the electronic device 10, the heat sources 451 that are disposed on the front side thereof may be driven according to the driving of the circuit in order to thereby emit heat in the first direction. In addition, the heat sources 451 that are disposed on the back side of printed circuit board 450 may be driven in order to thereby emit heat in the second direction. According to this, since the heat may be excessively concentrated on the display 420 that is disposed in the front side of the electronic device 10, or since the heat may be excessively concentrated on the back cover 430 that is disposed in the back side of the electronic device 10, the heat radiating members 470 for dispersing the heat diffusion path are required to be disposed on the periphery of the back cover 430 in order to suppress the same.

In the present embodiment, the shield member 471 and the heat radiating member 470 may be disposed around each heat source 451 in order to thereby diffuse the heat through the periphery. The shield members 471 may be disposed to surround the heat sources 451 disposed on the upper and lower surfaces of the printed circuit board 450. The shield member 471 has an empty space therein to give an effect of the gap layer.

The heat radiating member 470 may be attached to the upper or lower surface of the shield member 471 so that the heat generated from the heat source 451 may pass through the inner space of the shield member 471 and may then reach the heat radiating member 470 to be radiated.

According to the present embodiment, the heat that is diffused from the heat sources 451 of the printed circuit board 450 may reach the display 420 or the back cover 430 through the shield members 471 and the heat radiating members 470.

The initial diffusion of the heat generated from the heat source 451 may be made through the space of the shield member 471, and the heat may be further diffused by passing through the heat radiating member 470. In particular, the heat radiating members 470 may effectively distribute the heat path to the display 420 that is placed in the first direction of the heat source 451 or the heat path to the back cover 430 that is placed in the second direction so that the temperature of a specific area on the outer surface of electronic device 10 may be substantially and significantly lowered.

Figure 16:
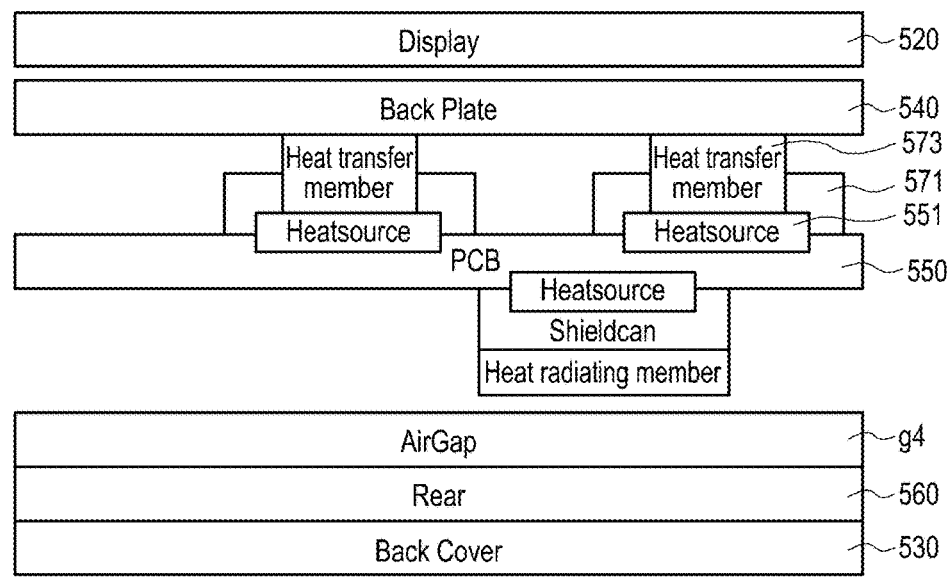
FIG. 16 is a simplified structural side view diagram illustrating example heat transfer members that are disposed in the heat sources of the printed circuit board, according to another example embodiment of the present disclosure.

FIG. 16 is a diagram illustrating a side view illustrating heat transfer members that are disposed in the heat sources of the printed circuit board, according to another embodiment of the present disclosure.

Referring to FIG. 16, the electronic device 10 may include: a first plate 540 that is directed in the first direction; a second plate 560 that is directed in the second direction, which is opposite to the first direction; a display 520 that is disposed to be exposed through a portion of the first plate; and a printed circuit board 550 that is disposed in a space between the first plate 540 and the second plate 560 and that includes one or more heat sources 551. In addition, the electronic device 10 may further include a back cover 530 that is disposed in the lower portion of the second plate 560, and that protects the electronic device 10 from the external impact that is applied from the rear.

One or more heat sources 551 that are disposed on the printed circuit board 550 of the electronic device 10 may be driven according to the driving of the circuit in order to thereby emit heat in the first direction and in the second direction.

In the present embodiment, the shield member 571 and the heat transfer member 573 may be disposed around each heat source 551 in order to thereby diffuse the heat. The shield members 571 may be disposed to surround the heat sources 551 that are disposed on the upper and lower surfaces of the printed circuit board 550. The shield member 571 has an empty space therein to give an effect of the gap layer above.

The heat transfer member 573 may be placed in at least one hole that is formed on the shield member 571 in order to thereby transfer the heat in the second direction, which is emitted from the heat source 551 and is headed in the first direction. For example, the heat transfer member 573 may play the role of reflecting the heat that is radiated toward the display 520 back to the back cover 530 so that the heat may evenly diffuse in the front and back surfaces. The heat transfer member 573 may be made of a silicon material (such as solid silicon or liquid silicon configured with a polymer), and may be made of a material having a high compression rate.

Although the structure that diffuses the heat in the second direction, which is emitted from the heat source 551 to then be headed in the first direction, it is apparent that the heat transfer member 573 may be disposed to diffuse the heat in the first direction, which is emitted from the heat source 551 to then be headed in the second direction.

According to the structure of the electronic device 10 described above, the temperature in a specific portion in the outer surface of the electronic device 10 can be significantly reduced.

Figure 17:
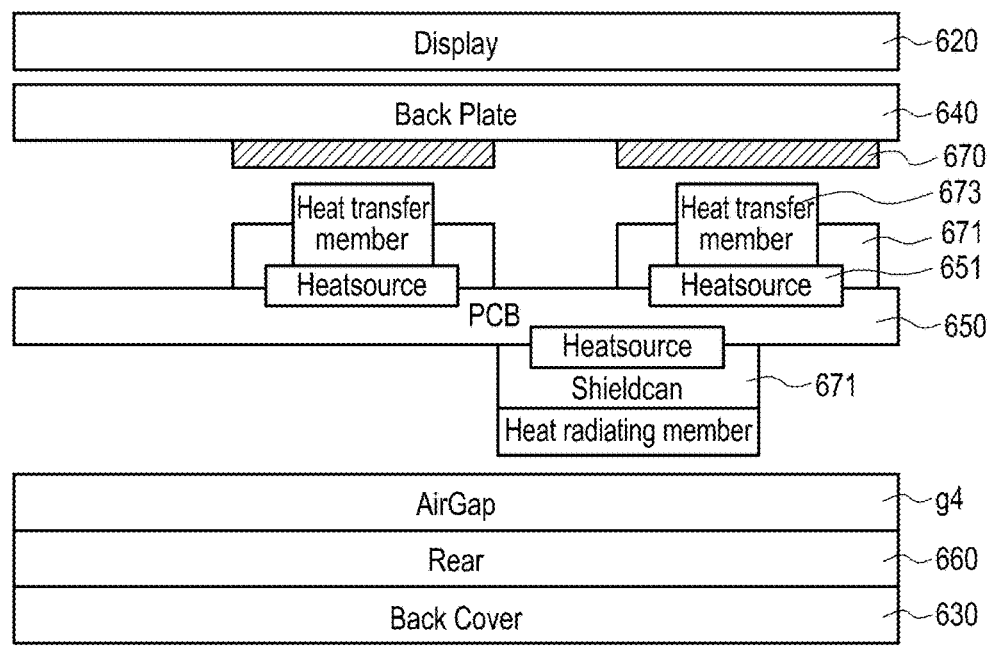
FIG. 17 is a simplified structural side view diagram illustrating a heat transfer member and a heat radiating member, which are disposed in the heat sources of the printed circuit board, according to another example embodiment of the present disclosure.

FIG. 17 is a diagram illustrating a side view illustrating heat transfer members and a heat radiating member, which are disposed in the heat sources of the printed circuit board, according to another embodiment of the present disclosure.

Referring to FIG. 17, one or more heat sources 651 that are disposed on the printed circuit board 650 of the electronic device 10 may be driven according to the driving of the circuit in order to thereby emit heat in the first direction and in the second direction.

In the present embodiment of FIG. 17, the heat radiating member 670 may be further disposed above the heat transfer member 673 with a gap interposed therebetween. Therefore, a large amount of heat that is generated from the heat sources 651 may diffuse in other directions through the heat transfer member 673, and the gap and the heat radiating members 670 may prevent the heat concentration on a specific area.

Although the heat transfer member 673 and the heat radiating member 670 corresponding to the heat that is headed in the first direction are provided, the present disclosure is not limited thereto, and the heat transfer member 673 and the heat radiating member 670 corresponding to the heat that is headed in the second direction may be provided under the printed circuit board 650. In addition, although the heat radiating member 670 is disposed to have a size corresponding to the heat source 651 and the heat transfer member 673, the heat radiating member 670 may be may be provided through the entire area of the lower surface of the first plate 640, or a plurality of heat radiating members may be formed to be separated from each other.

Furthermore, liquid heat radiating paint may be directly coated on the inner surface (for example, the side surface of the device or inner portions that are structurally complicated and curved) of the electronic device, which can hardly be applied with the solid heat radiating members, in order to give a heat radiating effect.

Hereinafter, a method for manufacturing the heat radiating structure of the electronic device 10 will be described in detail.

Figure 18:
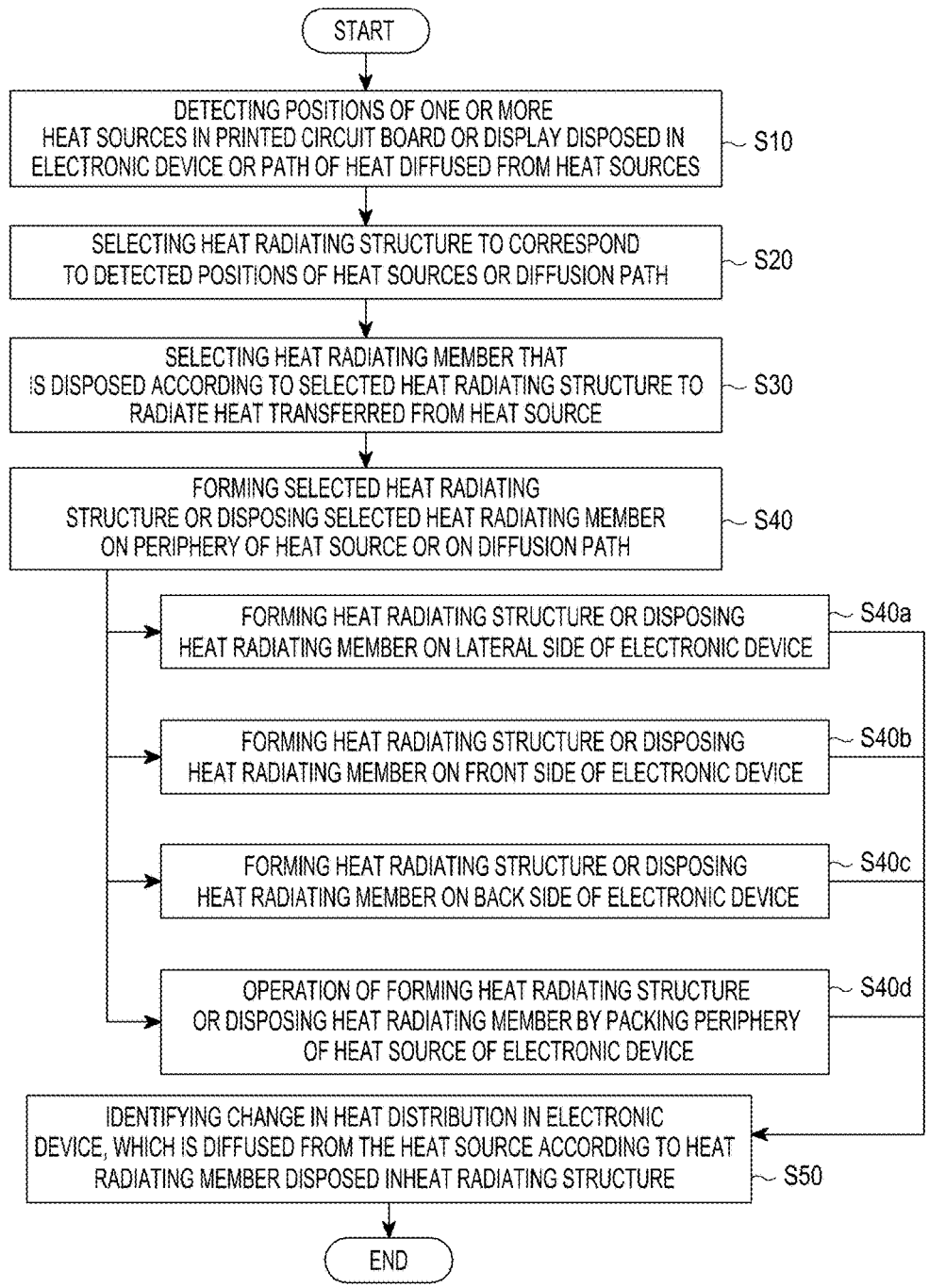
FIG. 18 is a flowchart illustrating an example method for manufacturing a heat radiating structure of the electronic device, according to an example embodiment of the present disclosure.

FIG. 18 is a flowchart illustrating an example method for manufacturing the heat radiating structure of the electronic device, according to an embodiment of the present disclosure.

Referring to FIG. 18, first, the position of at least one heat source 151 (see FIG. 5), which is disposed in the electronic device 10, or the path of the heat that diffuses from the heat source 151 may be detected in operation S10.

According to an embodiment, the heat sources 151 disposed in the electronic device 10 may include all of the components that radiate heat, such as a chip on the printed circuit board 150, an AMOLED (Active Matrix Organic Light-Emitting Diode), an LED (Light-Emitting Diode), or an LCD (Liquid Crystal Display) of the display 120, a battery, a power motor, a vibrator, a camera, or the like. Here, the display 120 may encompass all kinds of new display products in the future by using organic, inorganic, or natural materials to emit light for displaying a screen.

In addition, the heat sources 151 disposed in the printed circuit board 150 may be one or more chips that are disposed on the printed circuit board 150, and may include a PMIC, a PAM, an AP, a CP, and the like.

For example, in the case where the display 120 is the heat source 151, the heat is emitted toward the lower portion of the electronic device 10 (the second direction) in order to thereby form a diffusion path. In the case where the chips disposed on the printed circuit board 150 is the heat source 151, since the printed circuit board 150 is positioned between the first plate 140 and the second plate 160, the heat source 150 may emit heat toward the first plate 140 or the second plate 160 in order to thereby form a diffusion path.

After detecting the positions of the heat sources 151 and the heat diffusion path from the heat sources 151, a heat radiating structure may be selected to correspond to the positions of the heat sources 151 or the heat diffusion path in operation S20. In operation of selecting the heat radiating structure, the heat radiating structure may be manufactured to correspond to the portion on which the heat that is diffused from the heat source 151 is concentrated, and the portion, on which the heat diffused from the heat source 151 is concentrated, may be at least one of the lateral side, the front side, the back side, or the inner area of the electronic device 10.

According to the embodiment of the present disclosure, the lateral side denotes a rim area of the electronic device 10, which includes side keys, and requires the suppression of the heat concentration because it directly comes into contact with a user's palm or fingers. In addition, the front side denotes a display 120 area including a touch screen, and requires the suppression of the heat concentration because it directly comes into contact with a user's fingers or face (during the phone-call). In addition, the back side may be a back cover 130 area that covers the battery, and the inner area may be respective portions on the inner surface of the electronic device 10. The back side directly comes into contact with a user's palm to support the electronic device 10, and requires the suppression of the heat concentration. The inner area requires the suppression of the heat concentration in order to secure the effective operation of the elements inside the electronic device.

Next, in operation S30, the heat radiating member may be selected, which is disposed according to the selected heat radiating structure in order to radiate the heat transferred from the heat source. The heat radiating member 170, for example, may include a heat pipe, a solid heat radiating sheet, or liquid heat radiating paint. Here, the heat pipe, the solid heat radiating sheet, or the liquid heat radiating paint may include high thermal conductive materials, such as graphite, carbon nanotubes, natural recycled materials, or silicon.

In addition, afterwards, in operation S40, the selected heat radiating structure may be formed, or the selected heat radiating member 170 may be disposed on the periphery of the heat source 151 or on the diffusion path. The heat radiating structure may be at least one of the lateral side, the front side, the back side, or the inner area of the electronic device 10 as described above, and operation S40(*a*) of forming the heat radiating structure on the lateral side will be described first. Although operations S10 to S40 have been described regarding the embodiment of FIG. 5, the operations may be applied to other embodiments of the drawings of the present disclosure.

Operation S40(*a*) of forming the heat radiating structure and disposing the heat radiating member on the lateral side (see FIGS. 5 and 6) may include operation S41(*a*) of forming one or more open slits 163 in the side area 161 of the first plate 140 or second plate 160, which is disposed above or under the printed circuit board 150, and operation S43(*a*) of disposing the heat radiating member 170, which is made of a non-conductive material, in the side area including the formed operation slit 163.

According to an embodiment, the electronic device 10 may include: a first plate 140 that is directed in the first direction; a second plate 160 that is directed in the second direction, which is opposite to the first direction; a display 120 that is disposed to be exposed through a portion of the first plate; and a printed circuit board 150 that is disposed in a space between the first plate 140 and the second plate 160 and that includes one or more heat sources 151.

First, the heat radiation improvement structure of the side area of the second plate 160 will be described. In an embodiment of the present disclosure, since the second plate 160 including a metal material has a thermal conductivity, it may facilitate the diffusion of the heat generated from the heat source 151 of the printed circuit board 150 to the side area 161 so that the heat may be excessively concentrated on the side area 161 in order to thereby cause a temperature rise. The side area 161 of the electronic device 10 comes into direct contact with a palm or fingers when the user grips the electronic device 10, so the reduction in the temperature of the side area 161 is required.

Therefore, one or more open slits 163 may be formed in the side area 161 of the second plate 160. In addition to the open slit 163, the heat radiating member 170 may be disposed in the side area 161 of the second plate 160. The heat radiating member 170 may be disposed on the upper surface or lower surface of the open slit 163, as well as in the open slit 163. According to the present disclosure, although the open slit 163 is shaped into an elongated oval, the open slit 163 is not limited thereto, and may be designed in various shapes in the area where the heat is generated according to the heat diffusion path.

The heat transfer path to the side area 161 may be blocked or diverted because of the open slit 163 according to the improved structure, and the heat radiating member 170 may reduce the heat transfer and may induce the distribution and diffusion of heat in order to thereby lower the temperature of the side portion of the electronic device 10.

Next, the heat radiation improvement structure of the side area of the first plate 140 will be described. In another embodiment of the present disclosure, since the first plate 140 including a metal material has a thermal conductivity, it may facilitate the diffusion of the heat generated in the heat source 151 of the printed circuit board 150 to the side area so that the heat may be excessively concentrated on the side area in order to thereby cause a temperature rise. Therefore, according to the embodiment of the present disclosure, one or more open slits 143 may be formed in the side area of the first plate 140. In addition to the open slit 143, the heat radiating member 170 may be disposed in the side area of the first plate 140. The heat radiating member 170 may be disposed on the upper surface or lower surface of the open slit 143, as well as in the open slit 143.

According to the present embodiment, the heat diffusion path to the side area of the electronic device 10 can be diverted to the periphery so that the user can conveniently use the electronic device 10. The detailed description thereof is the same as in the embodiment above, so it will be omitted.

Next, operation S40(*b*) of forming the heat radiating structure and disposing the heat radiating member in the front side will be described (see FIGS. 8 to 11).

Operation S40(*b*) of forming the heat radiating structure in the front side may include operation S41(*b*) of disposing the heat radiating member 270 above the printed circuit board 250 while facing the same in order to radiate the heat that is emitted in the first direction in the case where the heat from the heat sources 251 disposed in the printed circuit board 250 is detected to be transferred to the display 220 that is directed in the first direction. In addition, the method may further include operation S43(*b*) of forming one or more gap layers (g1) on, or under, the heat radiating member 270 in order to sequentially diffuse the heat that is emitted in the first direction.

One or more heat sources 251 disposed in the printed circuit board 250 of the electronic device 10 may be driven according to the driving of the circuit in order to thereby emit heat in the first direction. According to this, since the heat may be excessively concentrated on the display 220 that is disposed in the front side of the electronic device 10, the heat radiating member 270 is required to be disposed to disperse the heat diffusion path to the periphery of the display 220 in order to suppress the same.

According to an embodiment, the first heat radiating member 270(*a*) may be interposed between the display 220 and the first plate 240 to radiate the heat that is generated in the heat source 251 disposed in the printed circuit board 250 and that is headed in the first direction. For example, the first heat radiating member 270(*a*) may be disposed to be in contact with the display 220 while facing the same, and may be disposed to be spaced a predetermined gap from the first plate 240 while facing the same. The first planar gap layer (g1) including the gap may be positioned in one side of the first heat radiating member 270(*a*) in order to induce the initial diffusion of the heat, which is generated from the heat source 251, through the first gap layer (g1) without the heat directly passing through the first heat radiating member 270(*a*). Therefore, the heat may be evenly distributed through the entire surface of the first heat radiating member 270(*a*) according to the initial diffusion, and may then reach the first heat radiating member 270(*a*) in order to thereby maximize the diffusion effect.

In addition, the first plate 240 may include a metal material, and may, for example, include Al or Mg. Since the metal material has a thermal diffusion property, additional heat distribution may be possible.

Therefore, according to the present embodiment, the heat that is diffused from the heat source 251 of the printed circuit board 250 may reach the display 220 through the first plate 240, the first gap layer (g1), and the first heat radiating member 270(*a*). The initial heat diffusion may be made through the first plate 240 made of a metal material, and subsequent diffusion may be made through the first gap layer (g1) and the first heat radiating member 270(*a*). In particular, the first heat radiating member 270(*a*) may effectively distribute the heat path to the display 220 that is placed in the first direction of the heat source 251 so that the temperature of a specific area in the display 220 may be substantially and significantly lowered.

According to another embodiment, the first heat radiating member 270(*a*) and the second heat radiating member 270(*b*) may be interposed between the display 220 and the first plate 240 in order to thereby radiate the heat that is transferred in the first direction from the heat source 251 on the printed circuit board 250.

Therefore, according to the present embodiment, the heat that is diffused from the heat source 251 of the printed circuit board 250 may reach the display 220 through the first plate 240, the first heat radiating member 270(*a*), the first gap layer (g1), and the second heat radiating member 270(*b*). The initial heat diffusion may be made through the first plate 240 made of a metal material, and subsequent diffusion may be made through the first gap layer (g1) and the first and second heat radiating members 270(a) and 270(b). In particular, the first heat radiating member 270(a) and the second heat radiating member 270(b) may effectively distribute the heat path to the display 220 that is placed in the first direction of the heat source 251 so that the temperature of a specific area in the display 220 may be substantially and significantly lowered. The detailed description has been made above, so it will be omitted.

According to another embodiment, a plurality of heat radiating members 270 may be provided. With regard to the heat radiating member 270, the first heat radiating member 270(a), the second heat radiating member 270(b), and the third heat radiating member 270(c) may be interposed between the display 220 and the printed circuit board 250 in order to thereby radiate the heat that is transferred in the first direction from the heat source 251 of the printed circuit board 250.

According to the present embodiment, the heat that is diffused from the heat source 251 of the printed circuit board 250 may reach the display 220 through the first heat radiating member 270(a), the first plate 240, the second heat radiating member 270(b), the first gap (g1), and the third heat radiating member 270(c). The heat from the heat source 251 may initially diffuse through the third heat radiating member 270(c), and may then diffuse through the first plate 240 that is made of a metal material. In addition, the heat may further diffuse through the second heat radiating member 270(b), the first gap (g1), and the first heat radiating member 270(a). In particular, the first heat radiating member 270(a), the second heat radiating member 270(b), and the third heat radiating member 270(c) may effectively disperse the heat path to the display 220 that is placed in the first direction of the heat source 251 so that the temperature of a specific area in the display 220 may be substantially and significantly lowered. The detailed description has been made above, so it will be omitted.

Next, operation S40(c) of forming the heat radiating structure and disposing the heat radiating member in the back side will be described (see FIGS. 12 to 13).

Operation S40(c) of forming the heat radiating structure in the back side may include operation S41(c) of disposing the heat radiating member 370 under the printed circuit board 350 to face the same in order to radiate the heat that is diffused in the second direction in the case where the heat from the heat source 351 disposed in the printed circuit board 350 is detected to be transferred to the back cover 330 that is directed in the second direction. In addition, the method may further include operation S43(c) of forming one or more gap layers (g2 and g3) on, or under, the heat radiating member 370 in order to sequentially radiate the heat that is emitted in the second direction.

One or more heat sources 351 disposed in the printed circuit board 350 of the electronic device 10 may be driven according to the driving of the circuit in order to thereby emit heat in the second direction. According to this, since the heat may be excessively concentrated on the back cover 330 that is disposed in the back side of the electronic device 10, the heat radiating member 370 is required to be disposed to disperse the heat diffusion path to the periphery of the back cover 330 in order to suppress the same.

According to an embodiment, the fourth heat radiating member 370(a) may be interposed between the second plate 360 and the back cover 330 in order to thereby radiate the heat that is generated from the heat sources 351 on the lower surface of the printed circuit board 350 to then be diffused in the second direction. For example, the fourth heat radiating member 370(a) may be disposed to be in contact with the back cover 330 while facing the same, and may be disposed to be spaced a predetermined gap from the second plate 360 while facing the same. The third planar gap layer (g3) including the gap is positioned in one side of the fourth heat radiating member 370(a) in order to induce the initial diffusion of the heat, which is transferred from the heat sources 351, through the third gap layer (g3) without the heat directly passing through the fourth heat radiating member 370(a). Therefore, the heat may be evenly distributed through the entire surface of the fourth heat radiating member 370(a) according to the initial diffusion, and may then reach the fourth heat radiating member 370(a) in order to thereby maximize the diffusion effect.

Therefore, according to the present embodiment, the heat that is diffused from the heat sources 351 of the printed circuit board 350 may reach the back cover 330 through the second gap layer (g2), the second plate 360, the third gap layer (g3), and the fourth heat radiating member 370(a). The initial diffusion of the heat may be made through the second gap layer (g2), and the heat may be further diffused by passing through the second plate 360 made of a metal material, the third gap layer (g3), and the fourth heat radiating member 370(a). In particular, the fourth heat radiating member 370(a) may effectively distribute the heat path to the back cover 330 that is placed in the second direction of the heat source 351 so that the temperature of a specific area in the back cover 330 may be substantially and significantly lowered.

According to another embodiment, a plurality of heat radiating members 270 may be disposed. The fourth heat radiating member 370(a) is disposed between the second plate 360 and the back cover 330, and the fifth heat radiating member 370(b) is disposed between the printed circuit board 350 and the second plate 360 in order to thereby sequentially radiate the heat that is generated from the heat sources 351 on the lower surface of the printed circuit board 350 to then be transferred in the second direction.

Therefore, according to the present embodiment, the heat that is diffused from the heat sources 351 of the printed circuit board 350 may reach the back cover 330 through the second gap layer (g2), the fifth heat radiating member 370(b), the second plate 360, the third gap layer (g3), and the fourth heat radiating member 370(a). The initial diffusion of the heat may be made through the second gap layer (g2), and the heat may be further diffused by passing through the fifth heat radiating member 370(b), the second plate 360 made of a metal material, the third gap layer (g3), and the fourth heat radiating member 370(a). In particular, the fourth heat radiating member 370(a) and the fifth heat radiating member 370(b) may effectively distribute the heat path to the back cover 330 that is placed in the second direction of the heat source 351 so that the temperature of a specific area in the back cover 330 may be substantially and significantly lowered. The detailed description has been made above, so it will be omitted.

Next, operation S40(d) of forming the heat radiation structure by packing the periphery of the heat source 451 will be described (see FIGS. 15 to 17).

Operation S40(d) of forming the packing structure on the periphery of the heat source 451 may include operation S41(d) of disposing the shield member 471 including a shield can or a shield film to surround at least a portion of the heat source 451 in order to improve the RF radiation performance and operation S43(d) of attaching the heat radiating member 470 onto the shield member 471.

In an embodiment of the present disclosure, the shield member 471 and the heat radiating member 470 may be disposed around each heat source 451 in order to thereby diffuse the heat through the periphery. The shield members 471 may be disposed to surround the heat source 451 disposed on the upper and lower surfaces of the printed circuit board 450. The shield member 471 has an empty space therein to give an effect of the gap layer. The heat radiating member 470 may be attached to the upper or lower surface of the shield member 471 so that the heat generated from the heat source 451 may pass through the inner space of the shield member 471 and may then reach the heat radiating member 470 to be radiated.

According to the present embodiment, the heat diffused from the heat sources 451 of the printed circuit board 450 may reach the display 420 or the back cover 430 through the shield members 471 and the heat radiating members 470.

The initial diffusion of the heat generated from the heat source 451 may be made through the space of the shield member 471, and the heat may be further diffused by passing through the heat radiating member 470. In particular, the heat radiating members 470 may effectively disperse the heat path to the display 420 that is placed in the first direction of the heat source 451 or the heat path to the back cover 430 that is placed in the second direction so that the temperature of a specific area on the outer surface of electronic device 10 may be substantially and significantly lowered.

In another embodiment of the present disclosure, operation S40(*d*) of forming the packing structure on the periphery of the heat source 551 may include operation S41(*d*) of disposing the shield member 571 including a shield can or a shield film to surround at least a portion of the heat source 551 in order to improve the RF radiation performance and operation S45(*d*) of forming one or more holes in the shield member 571 and of disposing the heat transfer member 573 to face the holes in order to transfer the heat in the second direction, which is generated from the heat source 551 and is headed in the first direction.

The heat transfer member 573 may play the role of reflecting the heat that is emitted to the display 520 back to the back cover 530 so that the heat may evenly diffuse in the front and back surfaces. The heat transfer member 573 may be made of a silicon material (such as solid silicon or liquid silicon configured with a polymer), and may be made of a material having a high compression rate.

Such a structure of the electronic device 10 may significantly reduce the temperature in a specific portion on the outer surface of the electronic device 10.

Furthermore, liquid heat radiating paint may be directly coated on the inner surface portions (for example, the side surface of the device or inner portions that are structurally complicated and curved) of the electronic device, which can hardly be applied with the solid heat radiating member, in order to give a heat radiation effect.

In addition, after operation S40 of forming the selected heat radiating structure or of disposing the selected heat radiating member on the periphery of the heat source or on the diffusion path, a change in the heat distribution in the electronic device 10, which is diffused from the heat source 151 according to the heat radiating member 170 disposed in the heat radiating structure, may be identified in operation S50.

According to various embodiments of the disclosure, the heat radiation improvement may be maximized by improving the structure of the heat radiation path of the electronic device and by selectively disposing the heat radiating members in appropriate positions. In addition, the performance of the product may be effectively enhanced by dispersing the heat concentration according to the heat radiation in a specific portion of the outer surface of the electronic device to other portions, and a structure for improving the heat radiating area that directly comes into contact with a user's skin may be implemented in the electronic device by using a metal material in order to thereby fulfill the consumer's needs.

Figure 19:
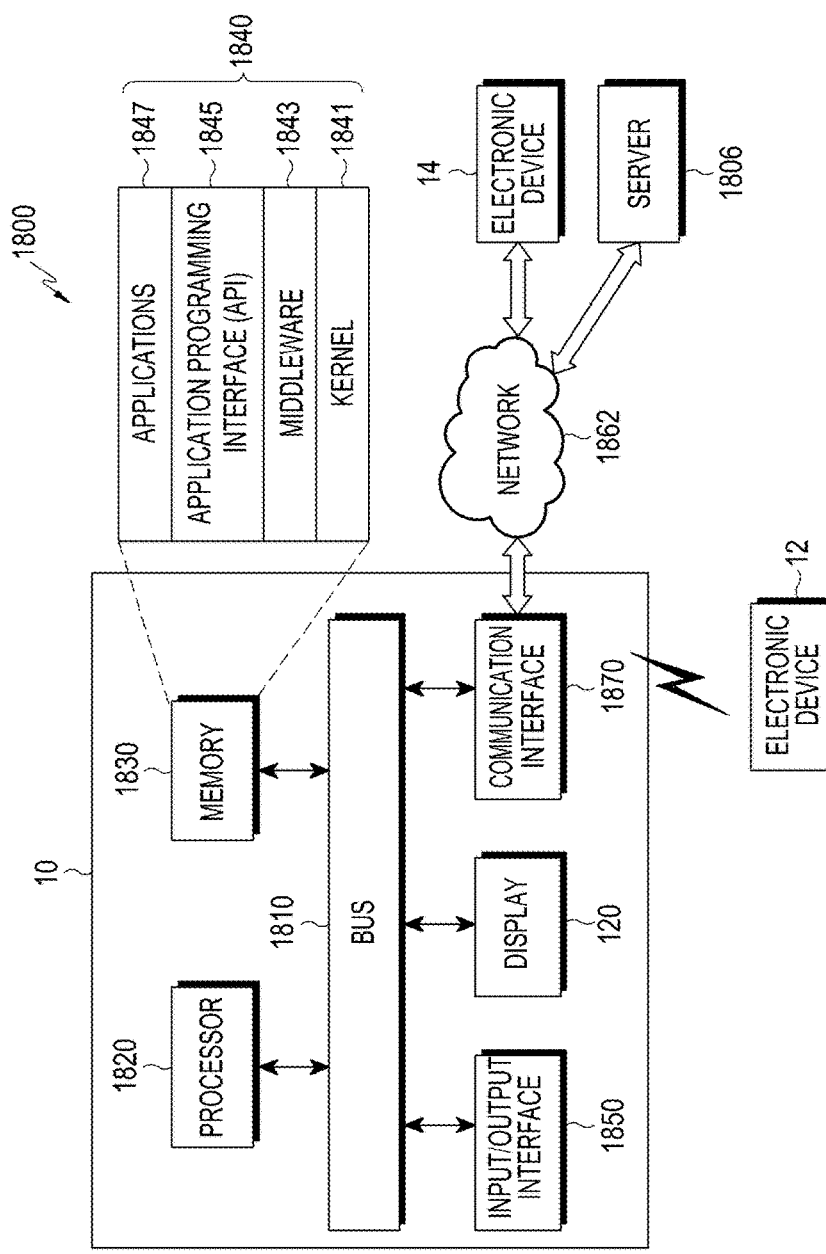
FIG. 19 is a block diagram illustrating an example network environment of an electronic device, according to an example embodiment of the present disclosure.

Referring to FIG. 19, the electronic device 10 in a network environment 1800, according to an embodiment of the present disclosure, will be described. The electronic device 10 may include a bus 1810, a processor 1820, a memory 1830, an input/output interface 1850, a display 120, and a communication interface 1870. In some embodiments, the electronic device 10 may exclude one or more elements or may add other elements thereto.

The bus 1810, for example, may include a circuit for connecting the elements 1810 to 1870 with each other and transferring communication data (e.g., control messages and/or data) between the elements.

The processor 1820 may include at least one of a central processing unit (CPU), an application processor (AP), or a communication processor (CP). The processor 1820, for example, may process a calculation or data that is related to the control and/or communication of one or more other elements of the electronic device 10.

The memory 1830 may include a volatile and/or non-volatile memory. For example, the memory 1830 may store instructions or data in relation to one or more other elements of the electronic device 10. According to an embodiment, the memory 1830 may store software and/or programs 1840. For example, the programs 1840 may include a kernel 1841, middleware 1843, an application programming interface (API) 1845, and/or an application programs (or "applications") 1847. At least some of the kernel 1841, the middleware 1843, or the API 1845 may be referred to as an operating system (OS).

The kernel 1841, for example, may control or manage system resources (e.g., the bus 1810, the processor 1820, or the memory 1830), which are used to execute the operation or function that is implemented in other programs (e.g., the middleware 1843, the API 1845, or the application programs 1847). In addition, the kernel 1841 may provide an interface by which the middleware 1843, the API 1845, or the application programs 1847 may access each element of the electronic device 10 for control or management.

The middleware 1843, for example, may play the intermediate role between the API 1845 or the application programs 1847 and the kernel 1841 to communicate with each other for the transmission and reception of data.

In addition, the middleware 1843 may process one or more operation requests that are received from the application programs 1847 according to the priority. For example, the middleware 1843 may give priority for using the system resources (e.g., the bus 1810, the processor 1820, or the memory 1830) of the electronic device 10 to the one or more application programs 1847. For example, the middleware 1843 may perform scheduling or load balancing for the one or more operation requests by processing the one or more operation requests according to the priority given to the one or more application programs 1847.

The API 1845, for example, may be an interface by which the application programs 1847 control functions that are provided by the kernel 1841 or the middleware 1843. For example, the API 1845 may include one or more interfaces or functions (e.g., instructions) for file control, window control, image processing, or text control.

The input/output interface 1850, for example, may play the role of an interface that transfers instructions or data received from a user or other external devices to other elements of the electronic device 10. For example, the input/output interface 1850 may output instructions or data received from the other elements of the electronic device 10 to the user or the other external devices.

The display 120, for example, may include a liquid crystal display (LCD), an LED (light emitting diode) display, an organic LED (organic light emitting diode) display, a micro electromechanical system (MEMS) display, or an electronic paper display. For example, the display 120 may display a variety of content (e.g., text, images, videos, icons, symbols, or the like) to the user. The display 120 may include a touch screen, and may receive a touch input, a gesture input, a proximity input, or a hovering input by using electronic pens or a user's body part.

The communication interface 1870, for example, may configure communication between the electronic device 10 and external devices (e.g., the first external electronic device 12, the second external electronic device 14, or a server 1806). For example, the communication interface 1870 may be connected to the network 1862 through wireless communication or wired communication in order to thereby communicate with the external devices (e.g., the second external electronic device 14, or the server 1806).

For example, the wireless communication may use, as a cellular communication protocol, at least one of LTE (long term evolution), LTE A (LTE Advance), CDMA (code division multiple access), WCDMA (wideband CDMA), a UMTS (universal mobile telecommunications system), WiBro (Wireless Broadband), GSM (Global System for Mobile Communications), or the like. In addition, the wireless communication, for example, may include a short range communication 1864. The short range communication 1864, for example, may include at least one of WiFi (wireless fidelity), Bluetooth, NFC (near field communication), or a GNSS (global navigation satellite system). The GNSS, for example, may include at least one of a GPS (global positioning system), a Glonass (global navigation satellite system), the Beidou Navigation Satellite System (hereinafter, "Beidou"), the Galileo, or the European global satellite based navigation system according to the usage area or bandwidth. Hereinafter, "GPS" may be interchangeably used with "GNSS" in the present specification. For example, the wired communication may include at least one of a USB (universal serial bus), an HDMI (high definition multimedia interface), RS-232 (recommended standard 232), or a POTS (plain old telephone service). The network 1862 may include at least one of the telecommunication networks, such as a computer network (e.g., LAN or WAN), the Internet, or a telephone network.

The first external device 12 and the second external device 14 may be the same as, or different from, the electronic device 10 in its type. According to an embodiment, the server 1806 may include a group of one or more servers. According to various embodiments, at least some, or all, of the operations that are executed in the electronic device 10 may be executed by one or more other electronic devices (e.g., the electronic device 12 or 14, or the server 1806). According to an embodiment, in the case where the electronic device 10 executes a specific function or service automatically or by request, the electronic device 10 may make a request to the other devices (e.g., the electronic device 12 or 14, or the server 1806) for at least some of the functions related to the function or service additionally or instead of executing the same by itself. The other electronic devices (e.g., the electronic device 12 or 14, or the server 1806) may execute the requested function or additional function, and may transfer the result thereof to the electronic device 10. The electronic device 10 may provide the requested function or service by providing the result or by additionally processing the same. To this end, for example, cloud computing, distributed computing, or client-server computing technology may be used.

The electronic device 10, which will be described below, may be one of the wearable device, the notebook, the net book, the smart phone, the tablet PC, the Galaxy Tab, the iPad, or the wireless charger, which has been described above. In the present embodiment, the electronic device 10 may be the smart phone.

The wireless charger, according to various embodiments of the present disclosure, refers to a device that wirelessly transmits/receives power in a short-range in order to thereby charge electronic devices.

Furthermore, the display unit of the electronic device may be configured to be extended by minimizing and/or reducing the bezel area while adopting a high-level design. Alternatively, the display unit may be configured to be flexible, or may be configured to have convex and concave portions.

That is, the periphery of the display unit may be bent so that the screen area may be extended to the side portion. With the bending of the screen area of the display unit to the side portion, the screen area may be enlarged to be used, or a separate screen may be displayed in the side portion while providing elegant design. In other words, the display unit may include the first view area and the second view area that is positioned on both sides of the first view area.

Figure 20:
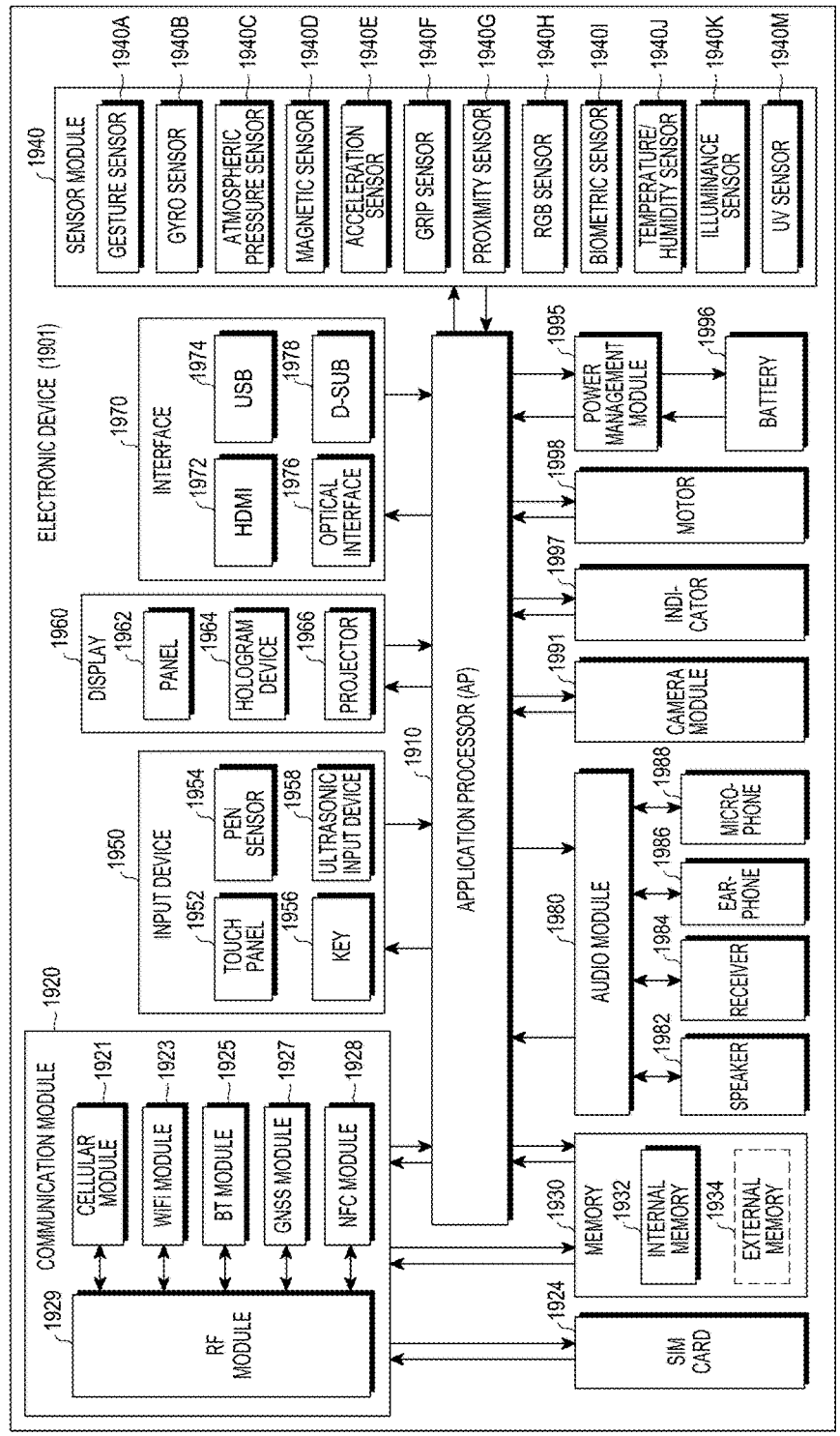
FIG. 20 is a block diagram illustrating an example structure of an electronic device, according to an example embodiment of the present disclosure.

FIG. 20 is a block diagram illustrating an electronic device 1901, according to various embodiments. The electronic device 1901, for example, may include all or some of the elements of the electronic device 10 illustrated in FIG. 1. The electronic device 1901 may include one or more processors (e.g., application processors (AP) 1910, a communication module (e.g., including communication circuitry) 1920, a subscriber identification module 1924, a memory 1930, a sensor module 1940, an input device (e.g., including input circuitry) 1950, a display 1960, an interface 1970, an audio module 1980, a camera module 1991, a power management module 1995, a battery 1996, an indicator 1997, or a motor 1998.

The processor 1910, for example, may control a multitude of hardware or software elements connected with the processor 1910, and may perform the processing of various pieces of data and a calculation by executing an operating system or application programs. The processor 1910 may be implemented by, for example, a system on chip (SoC). According to an embodiment, the processor 1910 may further include a graphic processing unit (GPU) and/or an image signal processor. The processor 1910 may include at least some (e.g., the cellular module 1921) of the elements illustrated in FIG. 19. The processor 1910 may load instructions or data received from one or more other elements (e.g., a non-volatile memory) to a volatile memory to then process the same, and may store a variety of data in a non-volatile memory.

The communication module 1920 may have the same or a similar configuration as the communication interface 1870 of FIG. 18. The communication module 1920, for example, may include various communication circuitry, such as, for example, and without limitation, at least one of a cellular module 1921, a WiFi module 1923, a Bluetooth module

1925, a GNSS module 1927 (e.g., a GPS module, a Glonass module, the Beidou module, or the Galileo module), an NFC module 1928, or a radio frequency (RF) module 1929.

The cellular module 1921, for example, may provide services of voice calls, video calls, text messaging, or the Internet through communication networks. According to an embodiment, the cellular module 1921 may perform identification and verification of the electronic device 1901 in communication networks by using the subscriber identification module (e.g., a SIM card) 1924. According to an embodiment, the cellular module 1921 may perform at least some of the functions provided by the processor 1910. According to an embodiment, the cellular module 1921 may include a communication processor (CP).

For example, each of the WiFi module 1923, the Bluetooth module 1925, the GNSS module 1927, or the NFC module 1928 may include a processor for processing data transmitted and received through the corresponding module. According to an embodiment, at least some (e.g., two or more) of the cellular module 1921, the WiFi module 1923, the Bluetooth module 1925, the GNSS module 1927, or the NFC module 1928 may be included in one integrated chip (IC) or one IC package.

The RF module 1929 may transmit and receive communication signals (for example, RF signals). The RF module 1929 may include, for example, a transceiver, a power amp module (PAM), a frequency filter, a low noise amplifier (LNA), antennas, or the like. According to another embodiment, at least one of the cellular module 1921, the WiFi module 1923, the Bluetooth module 1925, the GNSS module 1927 and the NFC module 1928 may transmit and receive RF signals through a separate RF module.

The subscriber identification module 1924, for example, may include a card that adopts a subscriber identification module card and/or an embedded SIM, and may contain inherent identification information {e.g., an integrated circuit card identifier (ICCID)} or subscriber information {e.g., an international mobile subscriber identity (IMSI)}.

The memory 1930 (e.g., the memory 1830) may include an internal memory 1932 or an external memory 1934. The internal memory 1932, for example, may include at least one of volatile memories {e.g., a dynamic RAM (DRAM), a static RAM (SRAM), a synchronous dynamic RAM (SDRAM), or the like} or non-volatile Memories {e.g., an one time programmable ROM (OTPROM), a programmable ROM (PROM), an erasable and programmable ROM (EPROM), an electrically erasable and programmable ROM (EEPROM), a mask ROM, a flash ROM, a flash memory (e.g., NAND flash or NOR flash), a hard drive, a solid state drive (SSD), or the like}.

The external memory 1934 may include a flash drive, and may further include, for example, compact flash (CF), secure digital (SD), micro secure digital (Micro-SD), mini secure digital (Mini-SD), extreme digital (xD), a memory stick, or the like. The external memory 1934 may be functionally and/or physically connected with the electronic device 1901 through various interfaces.

The sensor module 1940, for example, may measure physical quantities or may detect the operation state of the electronic device 1901 to thereby convert the measured or detected information to electric signals. The sensor module 1940 may include at least one of, for example, a gesture sensor 1940A, a gyro-sensor 1940B, an atmospheric pressure sensor 1940C, a magnetic sensor 1940D, an acceleration sensor 1940E, a grip sensor 1940F, a proximity sensor 1940G, a color sensor 1940H {e.g., a red-green-blue (RGB) sensor}, a biometric sensor 1940I, a temperature/humidity sensor 1940J, an illuminance sensor 1940K, and/or an ultra violet (UV) sensor 1940M. Alternatively or additionally, the sensor module 1940, for example, may further include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1940 may further include a control circuit for controlling one or more sensors included therein. In some embodiments, the electronic device 1901 may further include a processor as a part of the processor 1910 or separately from the processor 1910, which is configured to control the sensor module 1940 in order to thereby control sensor module 1940 while the processor 1910 is in a sleep mode.

The input device 1950, for example, may include various input circuitry, such as, for example, and without limitation, a touch panel 1952, a (digital) pen sensor 1954, keys 1956, or an ultrasonic input device 1958. The touch panel 1952 may use at least one of, for example, a capacitive type, a pressure type, an infrared type, or an ultrasonic type. In addition, the touch panel 1952 may further include a control circuit. The touch panel 1952 may further include a tactile layer in order to thereby provide a user with a tactile reaction.

For example, the (digital) pen sensor 1954 may be a part of the touch panel, or may include a separate recognition sheet. The keys 1956 may include, for example, physical buttons, optical keys, or a keypad. The ultrasonic input device 1958 detects ultrasonic waves that are generated in the input means through a microphone (e.g., a microphone 1988) to thereby identify data corresponding to the ultrasonic waves.

The display 1960 (e.g., the display 120) may include a panel 1962, a hologram device 1964, or a projector 1966. The panel 1962 may include the same, or a similar, configuration as the display 120 of FIG. 19. The panel 1962 may be implemented to be, for example, flexible, transparent, or wearable. The panel 1962 may be configured with the touch panel 1952 as a single module. The hologram device 1964 may display 3D images in the air by using interference of light. The projector 1966 may display images by projecting light onto a screen. The screen may be positioned, for example, inside or outside the electronic device 1901. According to an embodiment, the display 1960 may further include a control circuit for controlling the panel 1962, the hologram device 1964, or the projector 1966.

The interface 1970 may include, for example, at least one of a high-definition multimedia interface (HDMI) 1972, a universal serial bus (UBS) 1974, an optical interface 1976, or a D-subminiature (D-sub) 1978. The interface 1970 may be included in, for example, the communication interface 1870 illustrated in FIG. 19. Additionally or alternatively, the interface 1970 may include, for example, a mobile high-definition link (MHL) interface, a secure digital (SD) card/multi-media card (MMC) interface, or an infrared data association (IrDA) standard interface.

The audio module 1980, for example, may convert a sound into an electric signal, and vice versa. At least some elements of the audio module 1980 may be included, for example, in the input/output interface 1850 illustrated in FIG. 19. For example, the audio module 1980 may process voice information that is input or output through a speaker 1982, a receiver 1984, earphones 1986, or a microphone 1988.

The camera module 1991, for example, may be a device for photographing still and moving images, and, according to an embodiment, the camera module 1991 may include one or more image sensors (e.g., a front sensor or a rear sensor), lenses, an image signal processor (ISP), or a flash (e.g., an LED or a xenon lamp).

The power management module 1995, for example, may manage the power of the electronic device 1901. According to an embodiment, the power management module 1995 may include a power management integrated circuit (PMIC), a charger integrated circuit (IC), or a battery or fuel gauge. The PMIC may be implemented by a wired charging type and a wireless charging type. The wireless charging type may encompass, for example, a magnetic resonance type, a magnetic induction type, or an electromagnetic wave type, and additional circuits for wireless charging, such as coil loops, resonance circuits, or rectifiers, may be provided. The battery gauge may measure, for example, the remaining power of the battery 1996, a charging voltage, current, or temperature. The battery 1996 may include, for example, a rechargeable battery or a solar battery.

The indicator 1997 may display a specific state (for example, a booting state, a message state, or a charging state) of the whole or a part (e.g., the processor 1910) of the electronic device 1901. The motor 1998 may convert an electric signal to a mechanical vibration, and may provide a vibration or a haptic effect. Although it is not shown in the drawing, the electronic device 1901 may include a processing device (e.g., a GPU) for supporting mobile TV. The processing device for supporting mobile TV may process media data according to standards, such as, for example, digital multimedia broadcasting (DMB), digital video broadcasting (DVB), or mediaFlo™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

Figure 21:
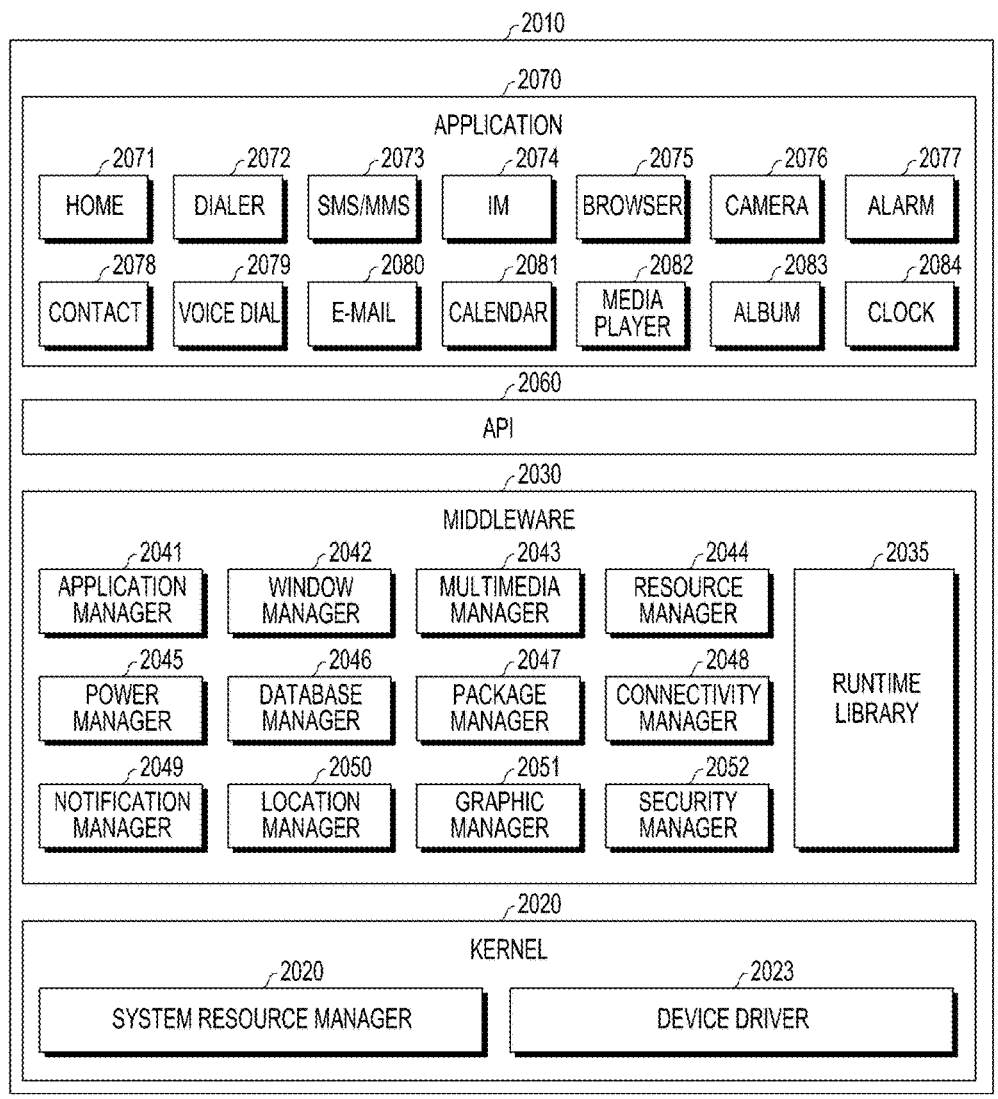
FIG. 21 is a block diagram illustrating an example software structure of an electronic device, according to an example embodiment of the present disclosure.

FIG. 21 is a block diagram illustrating a program module, according to various embodiments. According to an embodiment, the program module 2010 (e.g., the programs 1840) may include an operating system (OS) for controlling resources related to the electronic device (e.g., the electronic device 10) and/or various applications (e.g., the application programs 1847), which are operated under the operating system. For example, the operating system may be Android, iOS, Windows, Symbian, Tizen, Bada, or the like.

The program module 2010 may include a kernel 2020, middleware 2030, an application programming interface (API) 2060, and/or applications 2070. At least some of the program module 2010 may be preloaded in the electronic device, or may be downloaded from external electronic devices (e.g., the electronic devices 12 and 14, or the server 1806).

The kernel 2020 (e.g., the kernel 1841), for example, may include a system resource manager 2021 or a device driver 2023. The system resource manager 2021 may include, for example, a process management unit, a memory management unit, or a file system management unit. The device driver 2023 may include, for example, a display driver, a camera driver, a Bluetooth driver, a common memory driver, a USB driver, a keypad driver, a Wi-Fi driver, an audio driver, or an inter-process communication (IPC) driver.

The middleware 2030, for example, may provide functions required in common for the applications 2070, or may provide various functions through the API 2060 in order to allow the applications 2070 to effectively use limited system resources in the electronic device. According to an embodiment, the middleware 2030 (e.g., the middleware 1843) may include at least one of a run time library 2035, an application manager 2041, a window manager 2042, a multimedia manager 2043, a resource manager 2044, a power manager 2045, a database manager 2046, a package manager 2047, a connectivity manager 2048, a notification manager 2049, a location manager 2050, a graphic manager 2051, or a security manager 2052.

The run time library 2035, for example, may include a library module that a compiler uses in order to add new functions through programming languages while the applications 2070 are executed. The run time library 2035 may perform the input/output management, the memory management, or a function of an arithmetic calculation.

The application manager 2041, for example, may manage a life cycle of at least one of the applications 2070. The window manager 2042 may manage a GUI resource used in the screen. The multimedia manager 2043 may identify formats for reproducing various media files, and may perform encoding or decoding of media files by using a codec corresponding to each format. The resource manager 2044 may manage resources, such as source codes, memories, or storage spaces of one or more applications 2070.

The power manager 2045, for example, may manage a battery or power by operating in association with a basic input/output system (BIOS), and may provide power information that is necessary for the operation of the electronic device. The database manager 2046 may manage to create, retrieve, or change a database that is to be used in one or more applications 2070. The package manager 2047 may manage the installation or updating of the applications that are distributed in the form of a package file.

The connectivity manager 2048, for example, may manage a wireless connection, such as Wi-Fi or Bluetooth. The notification manager 2049 may display or notify of events (such as received messages, appointments, or proximity notifications) to the user without disturbance. The location manager 2050 may manage location information of the electronic device. The graphic manager 2051 may manage graphic effects to be provided to the user or user interfaces related thereto. The security manager 2052 may provide a general security function required for the system security or user authentication. According to an embodiment, in the case of the electronic device (e.g., the electronic device 10) adopting a phone call function, the middleware 2030 may further include a telephony manager for managing the functions of a voice call or a video call of the electronic device.

The middleware 2030 may include a middleware module through a combination of various functions of the above-described elements. The middleware 2030 may provide a module that is specialized according to the type of operating system in order to provide differentiated functions. In addition, the middleware 2030 may dynamically exclude some of the typical elements or add new elements.

The API 2060 (e.g., the API 1845), for example, may be a group of API programming functions, and may be provided as a different configuration according to an operating system. For example, one set of APIs may be provided to each platform in the case of Android or iOS, and two or more sets of APIs may be provided to each platform in the case of Tizen.

The applications 2070 (e.g., the application programs 1847) may include one or more applications that execute functions of home 2071, a dialer 2072, SMS/MMS 2073, instant messages (IM) 2074, a browser 2075, a camera 2076, an alarm 2077, contacts 2078, voice dial 2079, e-mail 2080, a calendar 2081, a media player 2082, an album 2083, a clock 2084, healthcare (e.g., measuring the amount of exercise or blood glucose), providing environment information (e.g., providing atmospheric pressure, humidity, or temperature information), or the like.

According to an embodiment, the applications 2070 may include an application (hereinafter, referred to as "information-exchange application" for the convenience of explanation) that supports the exchange of information between the electronic device (e.g., the electronic device 10) and the external electronic device (e.g., the electronic device 12 or 14). The information-exchange application, for example, may include a notification relay application for relaying specific information to the external electronic devices, or may include a device management application for managing the external electronic devices.

For example, the notification relay application may include a function of transferring notification information generated in other applications (e.g., the SMS/MMS application, the e-mail application, the healthcare application, or the environment information application) of the electronic device to the external electronic device (e.g., the electronic device 12 or 14). In addition, the notification relay application, for example, may receive notification information from the external electronic device to then provide the same to the user.

The device management application, for example, may manage (e.g., install, delete, or update): one or more functions {e.g., turning on and off the external electronic device (or some elements) or adjusting the brightness (or resolution) of a display} of the external electronic device (e.g., the electronic device 12 or 14) that communicates with the electronic device; applications executed in the external electronic device; or services (e.g., a phone call service or a messaging service) provided by the external electronic device.

According to an embodiment, the applications 2070 may include applications that are designated according to the attribute (e.g., the healthcare application of a mobile medical device) of the external electronic device (e.g., the electronic device 12 or 14). According to an embodiment, the applications 2070 may include applications that are received from the external electronic device (e.g., the server 1806 or the electronic device 12 or 14). According to an embodiment, the applications 2070 may include preloaded applications or third party applications that can be downloaded from a server. The names of the elements of the program module 2010, according to the embodiment, may vary depending on the type of operating system.

According to various embodiments, at least some of the program module 2010 may be implemented by software, firmware, hardware, or a combination thereof. At least some of the program module 2010, for example, may be implemented (e.g., executed) by the processor (e.g., the processor 1820). At least some of the program module 2010, for example, may include modules, program routines, sets of instructions, or processors for executing one or more functions.

The term "module" as used herein may, for example, refer to a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 1820), may cause the one or more processors to execute the function corresponding to the instruction. The computer-readable storage medium may be, for example, the memory 1830.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Further, some operations may be executed according to another order or may be omitted, or other operations may be added.

While the present disclosure has been illustrated and described with reference to certain embodiments thereof, it will be understood by those skilled in the art that various changes in form and details may be made therein without departing from the spirit and scope of the present disclosure as defined by the appended claims.

What is claimed is:

1. A method of manufacturing an electronic device, the method comprising:
    detecting positions of one or more heat sources disposed in a printed circuit board of the electronic device, in a display of the electronic device, or a path of heat that is diffused from the heat sources;
    selecting a heat radiating structure corresponding to the positions of the heat sources or the diffusion path;
    selecting an adiabatic member and/or a heat radiating member, disposed based on the selected heat radiating structure to respectively block or radiate the heat transferred from the heat source; and forming the selected heat radiating structure or disposing the selected adiabatic member or heat radiating member on a periphery of the heat source or on the diffusion path, wherein the forming of the heat radiating structure or the disposing of the adiabatic member comprises: forming one or more open slits in a side area of a first plate disposed above the printed circuit board or a second plate, which is disposed under the printed circuit board; and disposing the adiabatic member comprising a non-conductive material in the side area including the formed open slit.

2. The method according to claim 1, further comprising identifying a change in heat distribution in the electronic device diffused from the heat sources, based on the adiabatic member or heat radiating member disposed in the heat radiating structure.

3. The method according to claim 1, wherein the forming of the heat radiating structure or the disposing of the heat radiating member comprises:

disposing the heat radiating member above the printed circuit board to face the printed circuit board to diffuse the heat to the periphery, said heat diffused to the periphery being emitted in the first direction, when it is detected that the heat source disposed in the printed circuit board transfers the heat to a display that is disposed in the first direction.

4. The method according to claim 3, further comprising forming one or more gap layers on and/or under, the heat radiating member to sequentially diffuse the heat that is emitted in the first direction.

5. The method according to claim 1, wherein the forming of the heat radiating structure or the disposing of the heat radiating member comprises: disposing the heat radiating member on the lower surface of the display to radiate the heat that is emitted to the lower surface of the display when the heat is detected to be transferred from the heat source to the display that is disposed on the upper surface of the device.

6. The method according to claim 1, wherein the forming of the heat radiating structure or the disposing of the heat radiating member comprises:

disposing the heat radiating member under the printed circuit board to face the printed circuit board to diffuse the heat that is emitted in a second direction to the periphery when it is detected that the heat source disposed in the printed circuit board transfers the heat to a back cover that is directed in the second direction.

7. The method according to claim 6, further comprising: forming one or more gap layers on and/or under, the heat radiating member to sequentially diffuse the heat that is emitted in the second direction.

8. The method according to claim 1, wherein the forming of the heat radiating structure or the disposing of the heat radiating member comprises:

disposing a shield member to surround at least a part of the heat source, the shield member shielding electromagnetic waves generated from elements and diffuses the generated heat by forming a gap on the heat source.

9. The method according to claim 8, further comprising: attaching the heat radiating member onto the shield member.

10. The method according to claim 8, further comprising: forming one or more holes in the shield member; and disposing a heat transfer member facing the holes to transfer the heat, which is emitted from the heat source and is emitted in a first direction, in a second direction.

11. The method according to claim 1, wherein, in the selecting of the heat radiating structure, the heat radiating structure is positioned in an area on which the heat transferred from the heat source is concentrated and corresponding to at least one of a lateral side, a front side, a back side, or an inner area of the electronic device.

12. The method according to claim 1, wherein, in the selecting of the heat radiating member, the heat radiating member comprises at least one of a heat pipe, a solid heat radiating sheet, or liquid heat radiating paint, which can be disposed in the heat radiating structure.

* * * * *